(12) United States Patent
Oda et al.

(10) Patent No.: US 8,487,309 B2
(45) Date of Patent: Jul. 16, 2013

(54) THIN FILM TRANSISTOR WITH A SEMICONDUCTOR LAYER THAT INCLUDES A MICROCRYSTALLINE SEMICONDUCTOR LAYER AND DISPLAY DEVICE

(75) Inventors: Koji Oda, Tokyo (JP); Tomoyuki Irizumi, Tokyo (JP); Naoki Nakagawa, Tokyo (JP); Takeshi Ono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 270 days.

(21) Appl. No.: 13/010,281

(22) Filed: Jan. 20, 2011

(65) Prior Publication Data

US 2011/0198606 A1    Aug. 18, 2011

(30) Foreign Application Priority Data

Feb. 12, 2010   (JP) ................. 2010-028821

(51) Int. Cl.
*H01L 29/786* (2006.01)
(52) U.S. Cl.
USPC ............. 257/59; 257/72; 257/E29.292
(58) Field of Classification Search
USPC ........................ 257/59, 72, E29.292
See application file for complete search history.

(56) References Cited

U.S. PATENT DOCUMENTS

| 7,923,725 | B2 * | 4/2011 | Irizumi ............. 257/57 |
| 2007/0212827 | A1 | 9/2007 | Girotra et al. |
| 2009/0026453 | A1 | 1/2009 | Yamazaki |
| 2009/0321743 | A1 * | 12/2009 | Isa et al. ............. 257/66 |

FOREIGN PATENT DOCUMENTS

| JP | 10-189977 | 7/1998 |
| JP | 2007-221137 | 8/2007 |
| JP | 2009-55011 | 3/2009 |
| JP | 2009-117405 | 5/2009 |

\* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

An exemplary aspect of the present invention is a thin film transistor including: a gate electrode formed on a substrate; a gate insulating film that includes a nitride film and covers the gate electrode; and a semiconductor layer that is disposed to be opposed to the gate electrode with the gate insulating film interposed therebetween, and has a microcrystalline semiconductor layer formed in at least an interface in contact with the nitride film, in which the microcrystalline semiconductor layer contains oxygen at a concentration higher than that of contained nitrogen in at least the vicinity of the interface with the nitride film, the nitrogen being diffused from the nitride film.

13 Claims, 11 Drawing Sheets

US 8,487,309 B2

THIN FILM TRANSISTOR WITH A SEMICONDUCTOR LAYER THAT INCLUDES A MICROCRYSTALLINE SEMICONDUCTOR LAYER AND DISPLAY DEVICE

INCORPORATION BY REFERENCE

This application is based upon and claims the benefit of priority from Japanese patent application No. 2010-028821, filed on Feb. 12, 2010, the disclosure of which is incorporated herein in its entirety by reference.

BACKGROUND OF THE INVENTION

1. Field of the Invention

The present invention relates to a thin film transistor and a display device, and more particularly, to an inverted staggered thin film transistor and a display device that include a microcrystalline semiconductor film.

2. Description of Related Art

Liquid crystal display devices (LCDs), which are an example of flat panels, have advantages including low power consumption, compactness, and lightweight. The LCDs have been widely used as monitors for personal computers, portable information terminal devices, car navigation systems, and the like. In recent years, the LCDs have been widely used also as television monitors, and have replaced conventional cathode-ray tubes. Meanwhile, organic EL (Electro-Luminescence) display devices, which are superior in view angle, contrast, and responsiveness, have been vigorously developed as a next-generation flat panel.

In such display devices, a thin film transistor (TFT) that uses a semiconductor made of amorphous silicon for a channel layer has been used as a switching element for each display pixel. As examples of the structure of the TFT, MOS (Metal Oxide Semiconductor) structures such as a coplanar structure and a staggered structure are widely used. In the coplanar structure, a gate electrode and source/drain electrodes are disposed on the same side with respect to an amorphous silicon layer. In the staggered structure, the gate electrode and the source/drain electrode are disposed on different sides with respect to the amorphous silicon layer. Accordingly, in the staggered structure, the gate electrode and the source/drain electrodes are opposed to each other with the amorphous silicon film interposed therebetween. Examples of the staggered structure are classified into a top gate (forward staggered) type and a bottom gate (inverted staggered) type depending on the arrangement of the gate electrode with respect to the amorphous silicon layer.

In order to achieve a narrower frame and cost reduction of liquid crystal display devices and organic EL display devices, a display device having an integrated driving circuit in which the driving circuit such as a source driver or a gate driver using a TFT is formed on the same substrate as a pixel portion has been developed. The formation of the driving circuit on the same substrate as the pixel portion leads to a reduction in cost of an external IC. In addition, it is not necessary to provide a mounting area for the chip, resulting in a reduction in area of the frame.

A higher drive voltage is continuously applied to a driving TFT within the driving circuit for a longer period of time, as compared with a pixel TFT for pixel switching. This results in considerable deterioration in electrical characteristics. In view of this, there is proposed a TFT in which microcrystalline silicon is used as a silicon thin film of a channel layer. The TFT (microcrystalline silicon TFT) in which microcrystalline silicon is formed in a channel portion has such features that a temporal change in threshold voltage (Vth) of the TFT is small and deterioration in electrical characteristics is suppressed as compared to a TFT (amorphous silicon TFT) having amorphous silicon formed therein.

Examples of a method of forming microcrystalline silicon include a method of crystallizing, by laser annealing, amorphous silicon deposited by a plasma CVD method, and a method of direct deposition by the plasma CVD method. However, the manufacturing process for crystallization by laser annealing using an excimer laser or the like is complicated, which makes it difficult to achieve downsizing and cost reduction. For this reason, researches have been conducted to directly deposit microcrystalline silicon by the plasma CVD method.

When microcrystalline silicon (microcrystalline Si) is deposited using the plasma CVD method, it is important to improve the crystallization rate by removing an amorphous layer called an incubation layer at the initial stage of deposition. Particularly in an inverted staggered TFT, which can be produced with a small number of processes and is excellent in terms of mass production, a microcrystalline Si layer is formed on a gate insulating film. Accordingly, it is necessary to remove the incubation layer. This is because if an uncrystallized incubation layer is formed, the characteristics of a channel portion are deteriorated.

Methods for improving the crystallization rate by reducing the incubation layer are disclosed in Japanese Unexamined Patent Application Publications Nos. 2007-221137 and 2009-117405, for example. Japanese Unexamined Patent Application Publication No. 2007-221137 discloses that the crystal size uniformity of microcrystalline Si is improved by carrying out a plasma process on the gate insulating film by using $SiF_4$ or $SiF_4$—$H_2$ gas. Additionally, Japanese Unexamined Patent Application Publication No. 2009-117405 discloses a method in which the crystallinity of microcrystalline Si is improved by forming crystal nuclei on an insulating film using $SiF_4$ and $SiH_4$ gases and by further forming a microcrystalline Si layer using a deposition gas in place of the $SiF_4$ and $SiH_4$ gases.

However, as the incubation layer is reduced to improve the crystallization rate, another problem occurs. Particularly in the inverted staggered TFT in which a silicon nitride film is used as a gate insulating film, there arises a problem that a threshold of the TFT becomes a negative value as the incubation layer is reduced to improve the crystallization rate. The TFT having a negative threshold voltage (Vth) shows a characteristic of a considerable offset to the negative side in a curve (Id–Vg characteristic curve) showing characteristics of a gate voltage (Vg) and a source-drain current (Id).

FIG. 14 is a graph showing an Id–Vg characteristic curve in a linear region of a microcrystalline silicon TFT of the related art when the threshold is a negative value. Referring to FIG. 14, the Id–Vg curve of the microcrystalline silicon TFT of the related art when the threshold is a negative value is indicated by a dashed line, and the Id–Vg curve of an amorphous silicon (a-Si) TFT is indicated by a solid line. The Id–Vg curve shown in FIG. 14 is standardized by voltage-current characteristics of an a-Si TFT. As is seen from FIG. 14, the microcrystalline silicon TFT obtained when the threshold is a negative value shows a characteristic of a considerable offset to the negative side, as compared with the a-Si TFT. As is obvious from FIG. 14, even when no voltage is applied to the gate electrode (Vg=0 V), a current at a level of $\frac{1}{10}$ of an ON-state current flows.

When the microcrystalline silicon TFT having a negative threshold is used as a driving TFT, a current constantly flows therethrough and a circuit operation failure occurs due to the circuit configuration. Meanwhile, in the a-Si TFT, almost no current flows when Vg=0 V, there is no problem with the circuit operation. However, the a-Si TFT cannot be used as a driving TFT because of its low mobility. On the other hand, when the microcrystalline silicon TFT having a negative threshold is used as a pixel TFT for pixel switching, a negative offset does not pose any problem depending on the degree of offset. This is because the pixel TFT is turned on and off using a gate voltage (Vgh) during ON period and a gate voltage (Vgl) during OFF period. Accordingly, if the voltages Vgh and Vgl are shifted by the offset amount, the microcrystalline silicon TFT having a negative threshold can also be used as a pixel TFT.

The reason that the threshold of the inverted staggered TFT in which the silicon nitride film (SiN film) is used as the gate insulating film is considerably offset to the negative side seems to be as follows. Si—N bonds on the surface of the SiN film are broken by plasma upon deposition of microcrystalline Si. Then, nitrogen separated from the bonds enters the silicon crystal site during the process of forming microcrystalline Si, and acts as an n-type impurity (pentavalent), thereby generating free electrons.

FIG. 15 shows a profile representing a concentration distribution of oxygen and nitrogen measured by SIMS (Secondary Ion Mass Spectrometry) of the microcrystalline silicon TFT of the related art when the threshold is a negative value. Note that in FIG. 15, the nitride film indicates an SiN film formed as a gate insulating film, uc-Si indicates a microcrystalline silicon layer formed on the gate insulating film, a-Si indicates an amorphous silicon layer formed on the microcrystalline silicon layer and n-type a-Si indicates an ohmic contact layer formed on the amorphous silicon layer. As is clear from the profile representing the concentration distribution shown in FIG. 15, nitrogen (N) is diffused in the microcrystalline Si, and the concentration of nitrogen decreases as the distance from the nitride film. The diffusion of nitrogen defined herein indicates a curved portion (portion at which the slope is varied) of the profile as shown in FIG. 15.

Normally, the nitrogen impurity concentration in microcrystalline Si is preferably in the range of $1\times10^{18}$ cm$^{-3}$ to $3\times10^{18}$ cm$^{-3}$. When the above-mentioned problem occurs, however, the nitrogen concentration in the microcrystalline Si adjacent to the SiN film reaches a level of dozens of times the normal level. It is generally known that when microcrystalline Si is deposited without doping any impurities, the microcrystalline Si does not show a fully intrinsic property due to a defect of the silicon structure or the like, but exhibits a slight n-type characteristic. When the diffusion of nitrogen occurs, a relatively strong n-type characteristic is exhibited in the vicinity of the interface with the SiN film of microcrystalline Si, which facilitates formation of a channel. Thus, the Id–Vg characteristic (threshold) is offset to the negative side.

In the inverted staggered TFT, such a considerable offset to the negative side in the Id–Vg characteristic may not occur when an a-Si layer is stacked on the microcrystalline Si so as to reduce an OFF-state current. However, this is because a current Ids itself hardly flows due to an energy barrier caused by a bandgap difference between the microcrystalline Si layer and the a-Si layer or due to a high resistance layer caused by a defect in an interface portion, and thus a higher gate voltage Vg is required. Therefore, the above-mentioned problem becomes more remarkable in the TFT in which the interface resistance is reduced and the current Ids normally flows.

To solve the problem of the negative offset of the threshold voltage, it is possible to suppress the diffusion of N impurities into the microcrystalline Si. As a method for suppressing the diffusion of N impurities into the microcrystalline Si, a method of applying an oxide film to the gate insulating film can be employed. However, since the oxide film has a low dielectric constant, it is necessary to reduce the thickness of the gate insulating film to optimize the capacitance of the insulating film. The reduction in thickness of the gate insulating film causes a decrease in dielectric voltage and deterioration in particle coatability at the time of deposition, and further causes defects due to these factors. This results in deterioration in production yield. Further, the fermi level of the microcrystalline Si formed on the oxide film tends to be shifted to the valence band side. This results in an increase of the threshold voltage. Thus, when the oxide film is used as the gate insulating film, the TFT characteristics are deteriorated compared to the case where a nitride film is used.

Furthermore, when the oxide film is applied to the gate insulating film, there is another problem in that an optical leak current increases. The term "optical leak current" refers to a current generated when electron-hole pairs which are generated when light is incident on microcrystalline Si and a-Si stacked thereon flow through a silicon layer. In the microcrystalline Si in which the hole mobility is increased by crystallization, this optical leak current is liable to flow, and the degree of the optical leak current increases when the oxide film is used as the gate insulating film. The reason for this seems that the level acting as an acceptor level is generated on the valence band side in the microcrystalline Si formed on the oxide film, since the fermi level is shifted to the valence band side. For this reason, the TFT that suppresses the diffusion of N impurities into the microcrystalline Si by applying the oxide film to the gate insulating film is not suitable for a liquid crystal display device that irradiates the TFT with backlight, and cannot be used as a transistor for pixel switching.

To solve the problem of the negative offset of the threshold voltage, it is also possible to add a minute amount of p-type impurities to microcrystalline Si. For example, Japanese Unexampled Patent Application Publication No. 10-189977 discloses a technique in which microcrystalline Si is made intrinsic by adding a minute amount of $B_2H_6$ gas. Additionally, Japanese Unexamined Patent Application Publication No. 2009-117405 discloses a technique in which a silicon layer is formed by adding $B_2H_6$ and $BF_3$ and the concentration of boron contained in the silicon layer is set in the range of $1\times10^{14}$ cm$^{-3}$ to $6\times10^{16}$ cm$^{-3}$. Also, Japanese Unexampled Patent Application Publication No. 2009-055011 discloses a technique in which p-type or n-type impurities are added to silicon.

SUMMARY OF THE INVENTION

In the case where p-type impurities are added to silicon, however, when a negative bias is applied to a gate electrode, a p-type channel layer is formed. This causes problems of an increase in OFF-state current due to an increase in hole current and an increase in optical leak current upon irradiation of light. A method of adding a p-type dopant is not suitably used for a liquid crystal display device that irradiates a TFT with backlight, because a problem of crosstalk occurs.

The present invention has been made to solve the above-mentioned problems, and therefore an object of the present invention is to provide a thin film transistor and a display device that are capable of achieving highly reliable electrical characteristics.

A first exemplary aspect of the present invention is a thin film transistor including: a gate electrode formed on a substrate; a gate insulating film that includes a nitride film and covers the gate electrode; and a semiconductor layer that is disposed to be opposed to the gate electrode with the gate insulating film interposed therebetween, and has a microcrystalline semiconductor layer formed in at least an interface in contact with the nitride film, in which the microcrystalline semiconductor layer contains oxygen at a concentration higher than that of contained nitrogen in at least the vicinity of the interface with the nitride film, the nitrogen being diffused from the nitride film.

A second exemplary aspect of the present invention is a thin film transistor including: a gate electrode formed on a substrate; a gate insulating film that includes an SiN film having an N/Si composition ratio of 1.0 or less and covers the gate electrode; and a semiconductor layer that is disposed to be opposed to the gate electrode with the gate insulating film interposed therebetween, and has a microcrystalline semiconductor layer formed in at least an interface in contact with the SiN film.

According to exemplary aspects of the present invention, it is possible to provide a thin film transistor and a display device that are capable of achieving highly reliable electrical characteristics.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
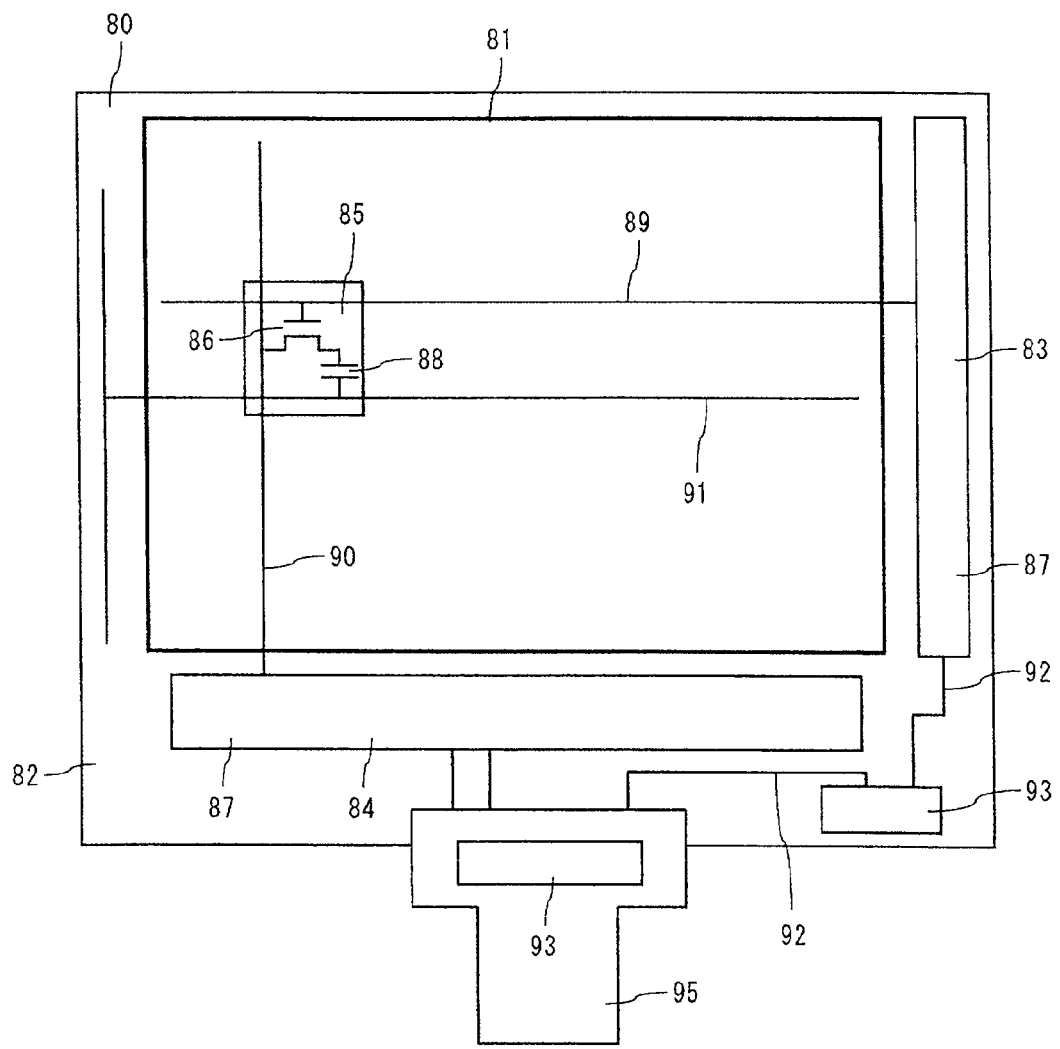
FIG. 1 is a front view showing an exemplary structure of a TFT array substrate for use in a liquid crystal display device according to a first exemplary embodiment of the present invention.

Hereinafter, exemplary embodiments of the present invention will be described with reference to the accompanying drawings. The following description and the drawings are omitted or simplified as appropriate for clarity of the explanation. Further, a redundant description is omitted as appropriate for clarity of the explanation. The same components are denoted by the same reference numerals throughout the drawings, and the description thereof is omitted as appropriate.

<First Exemplary Embodiment>

Referring first to FIG. 1, a display device according to a first exemplary embodiment of the present invention will be described. FIG. 1 is a front view showing an exemplary structure of a TFT array substrate for used in a liquid crystal display device according to the first exemplary embodiment. The display device according to the first exemplary embodiment is described using a liquid crystal display device by way of example. Alternatively, a flat panel display device such as an organic EL display device may also be used. The first exemplary embodiment exemplifies a case where the present invention is applied to a typical liquid crystal display device. The accompanying drawings are schematic and the components shown in the drawings are not to scale.

The liquid crystal display device according to the first exemplary embodiment includes a liquid crystal display panel. The liquid crystal display panel has a structure in which a pair of substrates are opposed to each other and liquid crystals are sealed in a gap between the substrates and a seal member for bonding the substrates. As shown in FIG. 1, on one of the substrates, pixel TFTs 86 serving as switching elements for controlling turning ON/OFF of the supply of a display voltage to be applied to the liquid crystal are formed so as to respectively correspond to pixels 85, each of which is a unit of display of an image.

The pixel TFTs 86 that are respectively provided in the pixels 85 are arranged in an array on the substrate. Thus, the substrate having the pixel TFTs 86 arranged thereon is referred to as a TFT array substrate 80. On the TFT array substrate 80, there are also provided a display unit 81 that displays an image, and a frame area 82 that is formed so as to surround the display unit 81. The display unit 81 is provided with a plurality of gate lines (scanning signal lines) 89, a plurality of storage capacitor lines 91, and a plurality of source lines (display signal lines) 90.

The plurality of gate lines 89 and the plurality of storage capacitor lines 91 are opposed to each other and formed in parallel with each other. The plurality of source lines are formed in parallel with each other. The source lines 90 are disposed to be perpendicular to the gate lines 89 and the storage capacitor lines 91. Further, a region surrounded by the gate line 89 and the storage capacitor line 91, which are adjacent each other, and by two adjacent source lines 90 corresponds to the pixel 85. Accordingly, the pixels 85 are arranged in a matrix form in on the TFT array substrate 80.

In each of the pixels 85, at least one pixel TFT 86 and at least one storage capacitor 88 are formed. The storage capacitor 88 is connected in series with the pixel TFT 86. The pixel TFT 86 serves as a switching element for supplying a display voltage to a pixel electrode. The gate electrode of the pixel TFT 86 is connected to the corresponding gate line 89 and controls ON/OFF of the pixel TFT 86 by using a gate signal supplied from the gate line 89. The source electrode of the pixel TFT 86 is connected to the corresponding source line 90. When the pixel TFT 86 is turned on, a current flows from the source electrode of the pixel TFT 86 to the drain electrode thereof. As a result, the display voltage is applied to the pixel electrode connected to the drain electrode. Then, an electric field corresponding to the display voltage is generated between the pixel electrode and an opposing electrode. The storage capacitor 88 is connected in parallel with the pixel electrode. Thus, upon application of the voltage to the pixel electrode, the voltage is also applied to the storage capacitor 88, and electrical charge can be stored in the storage capacitor 88 for a certain period of time.

In the frame area 82 of the TFT array substrate 80, a scanning signal driving circuit (gate driver) 83 and a display signal driving circuit (source driver) 84 are provided. The scanning signal driving circuit 83 and the display signal driving circuit 84 are each provided with a driving TFT 87 which is formed in the same manufacturing process as that of the pixel TFTs 86 within the display unit 81. Thus, the liquid crystal display device according to the first exemplary embodiment is a liquid crystal display device having an integrated driving circuit. The gate lines 89 extend from the display unit 81 to the frame area 82, and are connected to the scanning signal driving circuit 83 in the frame area 82. Similarly, the source lines 90 extend from the display unit 81 to the frame area 82, and are connected to the display signal driving circuit 84.

External lines 92 connect the scanning signal driving circuit 83 and the display signal driving circuit 84 with external terminals at an edge of the TFT array substrate 80. In the external terminals, IC chips 93 and a printed board 95 are mounted and electrically connected to each other. In this configuration, various external signals are supplied from the printed board 95 to the scanning signal driving circuit 83 and the display signal driving circuit 84 through the external terminals. Based on these signals, the gate signal (scanning signal) is supplied to each of the gate lines 89, and the pixel TFTs 86 are sequentially selected. Similarly, display signals are supplied to each of the source lines 90, and the display voltage corresponding to display data is supplied to each of the pixels 85. On the uppermost surface of the TFT array substrate 80, an alignment layer is formed. The TFT array substrate 80 is formed in the manner as described above.

An opposing substrate (not shown) is opposed to the TFT array substrate 80 formed as described above. The opposing substrate is a color filter substrate, for example, and is placed on the viewing side. On the opposing substrate, a color filter (color material), a black matrix (BM), the opposing electrode, an alignment layer, and the like are formed. As in an IPS (In-Plane Switching) mode liquid crystal display device, for example, the opposing electrode may be placed on the TFT array substrate 80 side.

Liquid crystals are injected between the TFT array substrate 80 and the opposing substrate. On the outer surfaces of the TFT array substrate 80 and the opposing substrate, polarizing plates are attached. The liquid crystal display panel is structured as described above.

Further, a backlight unit is disposed on the non-viewing side of the liquid crystal panel, which is structured as described above, through an optical film such as a retardation plate. The liquid crystal display panel and peripheral members are housed as needed in a frame made of resin, metal, or the like. The liquid crystal display device of the first exemplary embodiment is structured in the manner as described above.

Next, a display operation of the liquid crystal display device according to the first exemplary embodiment will be briefly described. The liquid crystals are driven by an electric field generated between the pixel electrode and the opposing electrode. That is, as the orientation direction of the liquid crystals between the substrates changes, the amount of light passing through the liquid crystal varies. Specifically, among the transmitted light that transmits through the liquid crystal display panel from the backlight unit, the amount of light passing through the polarizing plate on the viewing side varies depending on the orientation direction of the liquid crystals. The orientation direction of the liquid crystals varies depending on a display voltage to be applied. Therefore, it is possible to change the amount of light passing through the polarizing plate on the viewing side by controlling the display voltage. In other words, the amount of light to be displayed as an image can be controlled. In such a series of operations, the storage capacitor 88 contributes to the retention of the display voltage.

Figure 2:
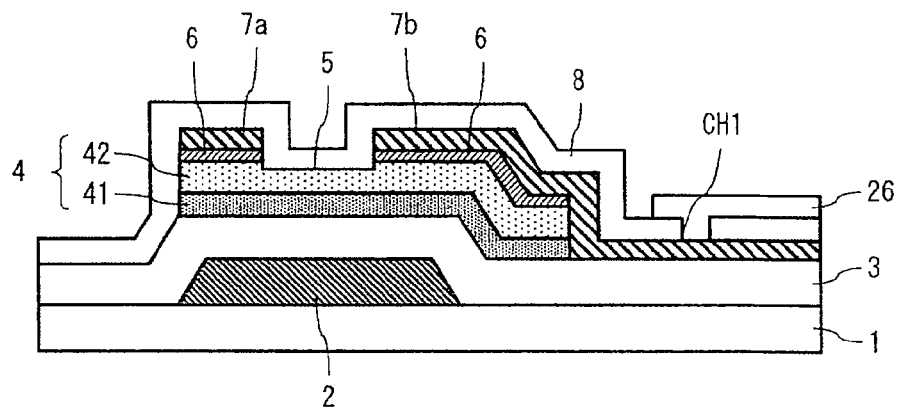
FIG. 2 is a sectional view showing the structure of the TFT according to the first exemplary embodiment.

Next, a TFT structure for used in the liquid crystal display device of the first exemplary embodiment will be described with reference to FIG. 2. FIG. 2 is a sectional view showing the structure of the TFT according to the first exemplary embodiment. The TFT according to the first exemplary embodiment is a microcrystalline semiconductor TFT of an inverted staggered type. While the TFT is used for both the pixel TFT 86 and the driving TFT 87, the pixel TFT 86 is described below by way of example.

Referring to FIG. 2, a gate electrode 2 is formed into a desired shape on a transparent insulating substrate 1 made of glass, quartz, or the like. The gate electrode 2 is formed of a metal, such as Cr, with a thickness of about 400 nm, for example.

A gate insulating film 3 including a nitride film is formed so as to cover the gate electrode 2. The gate insulating film 3 has a thickness of 350 to 450 nm, for example. In this exemplary embodiment, the gate insulating film 3 is formed of a nitride film such as a silicon nitride film (SiN film), for example.

Then, on the gate insulating film 3, a semiconductor layer 4 is formed. The semiconductor layer 4 is formed in an island shape so as to be opposed to the gate electrode 2 with the gate insulating film 3 interposed therebetween. The semiconductor layer 4 may be formed so as to protrude from the gate electrode 2 in plan view above the gate insulating film 3.

The semiconductor layer 4 includes a microcrystalline semiconductor layer 41, and an amorphous semiconductor layer 42 stacked on the microcrystalline semiconductor layer 41. That is, the semiconductor layer 4 has a stacked structure in which the amorphous semiconductor layer 42 is stacked on the microcrystalline semiconductor layer 41. The microcrystalline semiconductor layer 41 constituting the semiconductor layer 4 is formed on at least an interface in contact with the nitride film included in the gate insulating film 3. In other words, the microcrystalline semiconductor layer 41 is disposed on the gate insulating film 3 side of the semiconductor layer 4. The amorphous semiconductor layer 42 stacked on the microcrystalline semiconductor layer 41 enables suppression of an OFF-state current of the TFT. In this exemplary embodiment, i-type microcrystalline silicon (i-type us-Si) is formed with a thickness of about 30 nm, for example, as the microcrystalline semiconductor layer 41. Further, i-type amorphous silicon (i-type a-Si) is formed with a thickness of 130 to 150 nm, for example, as the amorphous semiconductor layer 42.

In this case, the microcrystalline semiconductor layer 41 contains nitrogen, as in the case of the TFT of the related art. As described above, the nitrogen is diffused from the gate insulating film 3 and is contained in the microcrystalline semiconductor layer 41 such that the concentration of the nitrogen decreases as the distance from the interface with the gate insulating film 3.

Moreover, in the first exemplary embodiment, the microcrystalline semiconductor layer 41 contains oxygen at a concentration which is extremely higher than a level at which oxygen is normally introduced. The concentration of the oxygen contained in the vicinity (about 10 to 15 nm) of the interface of the microcrystalline semiconductor layer 41 with the gate insulating film 3, which corresponds to a region in which a channel serving as a current path is formed, is higher than that of the nitrogen. As described in detail later, when the concentration of the oxygen contained in at least the vicinity of the interface of the microcrystalline semiconductor layer 41 with the gate insulating film 3 is higher than that of the nitrogen diffused from the gate insulating film 3, a negative offset of the threshold voltage can be suppressed.

However, if the concentration of the oxygen contained in the interface of the microcrystalline semiconductor layer 41 with the gate insulating film 3 exceeds $2\times10^{21}$ cm$^{-3}$, the mobility of the TFT is lowered, and a swing factor (S value) associated with response characteristics increases. This seems to be because an oxygen cluster formed partially in the vicinity of the interface and a defect occurring due to oxygen inhibit the movement of electrons, even though the concentration of oxygen with respect to Si is sufficiently lower than the composition ratio (O/Si=2) of silicon oxide. Since the characteristics deteriorate when the concentration of the oxygen contained in the interface of the microcrystalline semiconductor layer 41 with the gate insulating film 3 is too high, it is preferable to set the concentration of the oxygen to $1\times10^{21}$ cm$^{-3}$ or lower in consideration of a process margin or the like. Accordingly, the concentration of the oxygen contained in the microcrystalline semiconductor layer 41 is higher by about one or two digits than $1\times10^{18}$ cm$^{-3}$ to $5\times10^{18}$ cm$^{-3}$ that is a level at which the impurities are mixed.

Further, the microcrystalline semiconductor layer 41 contains oxygen with a predetermined distribution in the thickness direction. Specifically, the concentration of the oxygen decreases as the distance from the interface with the gate insulating film 3. In this case, for example, the concentration of the oxygen decreases as the distance from the interface of the microcrystalline semiconductor layer 41 with the gate insulating film 3 so that the concentration of the oxygen at the interface with the amorphous semiconductor layer 42 becomes $5\times10^{19}$ cm$^{-3}$ or lower. As described above, at the interface between the microcrystalline semiconductor layer 41 and the amorphous semiconductor layer 42, a high-resistance layer is liable to be formed due to an energy barrier caused by a bandgap difference or due to a defect of the interface. In the first exemplary embodiment, the concentration of oxygen is decreased as the distance from the interface with the gate insulating film 3, thereby preventing an increase in resistance at the interface between the microcrystalline semiconductor layer 41 and the amorphous semiconductor layer 42. Accordingly, a favorable ON-state current can be ensured.

On the semiconductor layer 4 thus formed, an ohmic contact layer 6 is formed. The ohmic contact layer 6 is formed on substantially the entire surface of the semiconductor layer 4 except for a channel region 5 of the TFT. The ohmic contact layer 6 is formed of an amorphous semiconductor layer in which conductive impurities are doped. In this case, the ohmic contact layer 6 is formed of amorphous silicon (n$^+$-type a-Si) or the like in which n-type impurities, such as phosphorus (P), are doped at high concentration with a thickness of 20 to 50 nm, for example.

Regions of the semiconductor layer 4 in which the ohmic contact layer 6 is stacked serve as source/drain regions. Specifically, a region of the semiconductor layer 4 which is located under the ohmic contact layer 6 on the left side of FIG. 2 serves as the source region, and a region of the semiconductor layer which is located under the ohmic contact layer 6 on the right side of FIG. 2 serves as the drain region. Thus, on both sides of the semiconductor layer 4 constituting the TFT, the source/drain regions are formed. Further, a region sandwiched between the source/drain regions of the semiconductor layer 4 serves as the channel region 5. On the channel region 5 of the semiconductor layer 4, the ohmic contact layer 6 is not formed.

On the ohmic contact layer 6, a source electrode $a$ and a drain electrode 7$b$ are formed. Specifically, the source electrode 7$a$ is formed on the ohmic contact layer 6 at the source region side of the semiconductor layer 4, and the drain electrode 7$b$ is formed on the ohmic contact layer 6 at the drain region side of the semiconductor layer 4. Thus, the microcrystalline semiconductor TFT of the inverted staggered type is formed. Further, the source electrode 7$a$ and the drain electrode 7$b$ are formed so as to extend outside the channel region 5 of the semiconductor layer 4. That is, the source electrode 7$a$ and the drain electrode 7$b$ are not formed on the channel region 5 of the semiconductor layer 4, like the ohmic contact layer 6. The source electrode 7$a$ and the drain electrode 7$b$ are formed on a Cr film with a thickness of about 50 nm and are formed of a stacked film of an Al—Si—Cu film with a thickness of about 300 nm, for example.

A protective insulating film 8 is formed so as to cover the source electrode 7$a$, the drain electrode 7$b$, and the semiconductor layer 4. The protective insulating film 8 has a contact hole CH1 that reaches the drain electrode 7$b$. In this case, the protective insulating film 8 is formed of a silicon nitride film with a thickness of about 300 nm, for example.

Further, a pixel electrode 26, which is connected to the drain electrode 7$b$ through the contact hole CH1, is formed on the protective insulating film 8. The pixel electrode 26 is formed of a transparent conductive film such as ITO.

Figure 3:
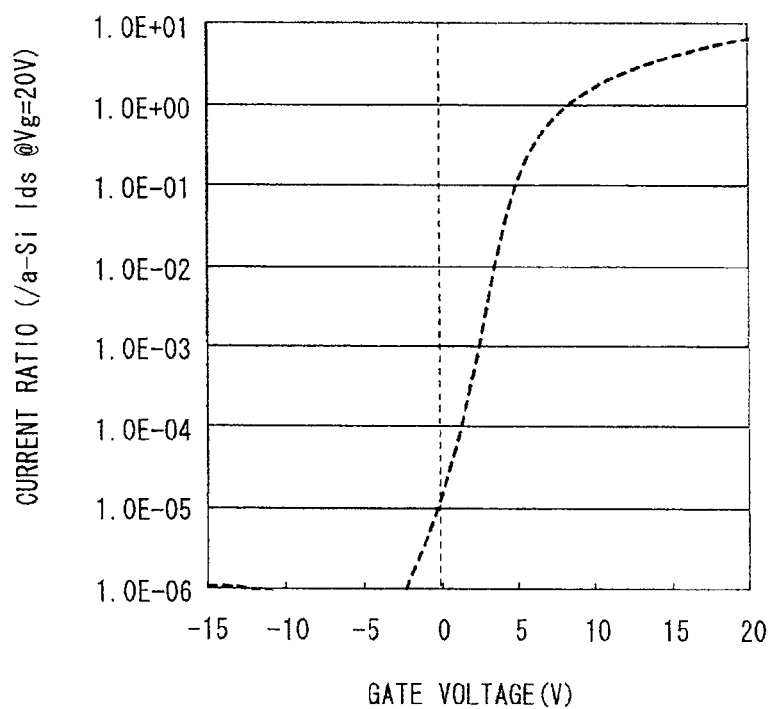
FIG. 3 is a graph showing an Id–Vg characteristic curve of the TFT according to the first exemplary embodiment.
Figure 14:
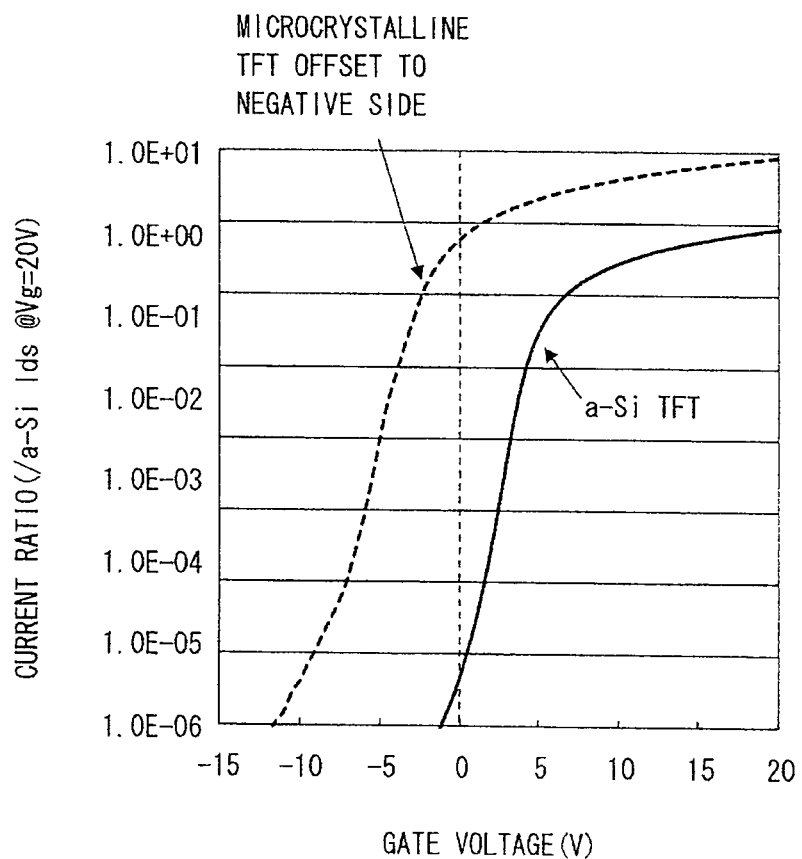
FIG. 14 is a graph showing an Id–Vg characteristic curve in a linear region of a microcrystalline silicon TFT of a related art when the threshold is a negative value.
Figure 15:
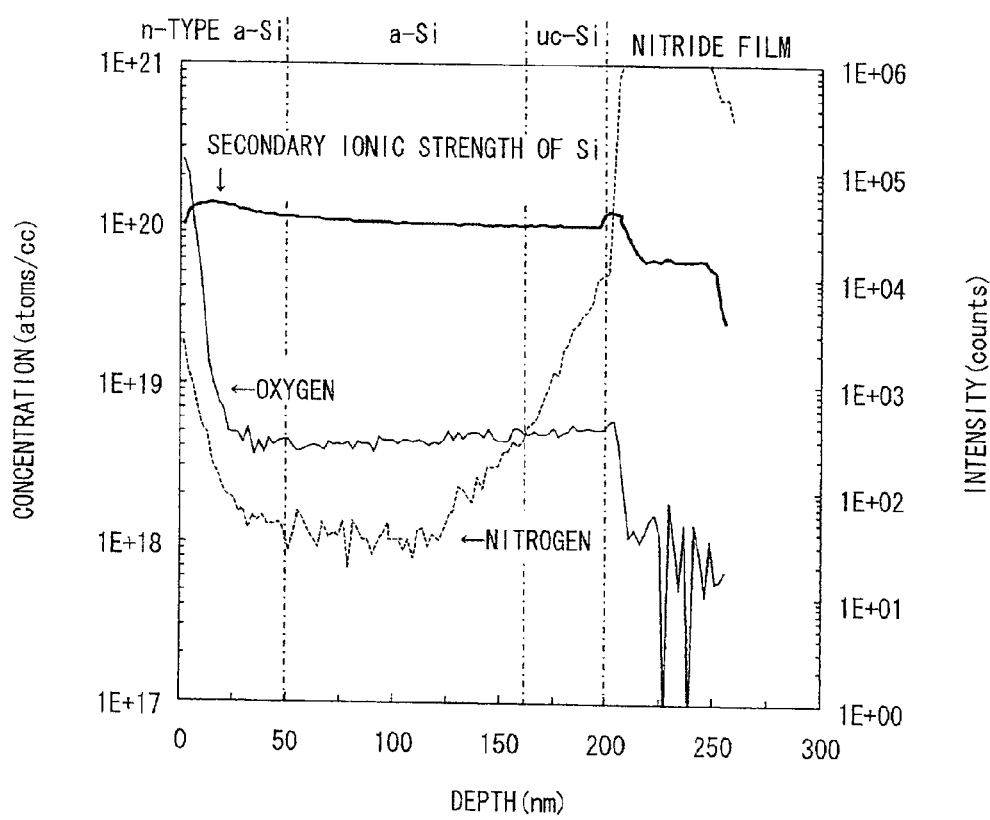
FIG. 15 is a profile representing a concentration distribution of oxygen and nitrogen measured by SIMS of the microcrystalline silicon TFT of the related art when the threshold is a negative value.

FIG. 3 shows an Id–Vg curve of the TFT according to the first exemplary embodiment having the structure as described above. FIG. 3 is a graph showing the Id–Vg characteristic curve of the TFT according to the first exemplary embodiment. The Id–Vg curve shown in FIG. 3 is standardized by the voltage-current characteristics of the a-Si TFT, like in the Id–Vg curve shown in FIG. 14. As shown in FIG. 3, in the TFT according to the first exemplary embodiment, the negative offset is resolved. Therefore, an excellent TFT can be obtained.

Next, a method of manufacturing the TFT according to the first exemplary embodiment will be described with reference to FIGS. 4A to 4D. FIGS. 4A to 4D are sectional views each showing a process for manufacturing the TFT according to the first exemplary embodiment. FIGS. 4A to 4D are sectional views showing process for manufacturing the components corresponding to those of FIG. 2.

First, a conductive film serving as the gate electrode 2 is deposited on the transparent insulating substrate 1 made of glass, quartz, or the like. A metal such as Cr can be used for the conductive film serving as the gate electrode 2. For example, Cr is deposited on the entire surface of the substrate 1 with a thickness of about 400 nm as conductive film serving as the gate electrode 2 by DC magnetron sputtering or the like. The film thickness may be changed depending on the type of metal to be used, as long as the conductivity that satisfies the device characteristics is obtained. However, the threshold voltage, the ON characteristics, and the mobility are lowered when the surface morphology of the gate insulating film 3 is deteriorated. The surface morphology of the gate insulating film 3 depends on the surface state of the lower layer. Accordingly, it is necessary to optimize the deposition conditions, including the process, for the conductive film serving as the gate electrode 2. In this case, sputtering is carried out using a Cr target while introducing Ar (argon) gas. The sputtering is carried out under the following conditions: 100 sccm of Ar (argon) gas, a pressure of 0.14 Pa, a power of 1.0 kw, and a temperature of 200° C.

Figure 4A:
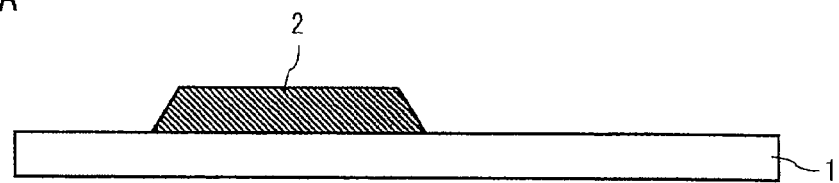
FIGS. 4A to 4D are sectional views each showing a manufacturing process for the TFT according to the first exemplary embodiment.

Next, a resist pattern is formed on the deposited conductive film by a photolithography process. Then, an etching process is carried out using the resist pattern as a mask, and the conductive film serving as the gate electrode 2 is patterned into a desired shape. After that, the resist pattern is removed. Thus, the gate electrode 2 is formed as shown in FIG. 4A.

Subsequently, the gate insulating film 3, the microcrystalline semiconductor layer 41, the amorphous semiconductor layer 42, and the ohmic contact layer 6 are deposited in this order so as to cover the gate electrode 2. These layers are deposited on the entire surface of the substrate 1 by a plasma CVD method or the like. The gate insulating film 3 may be formed of a nitride film such as a silicon nitride film. Further, for example, the microcrystalline semiconductor layer 41 may be formed of i-type uc-Si, the amorphous semiconductor layer 42 may be formed of i-type a-Si, and the ohmic contact layer 6 may be formed of $n^+$-type a-Si.

Herein, a silicon nitride film is first deposited as the gate insulating film 3. Specifically, the silicon nitride film is deposited by introducing a mixed gas of $N_2$, $SiH_4$, and $NH_3$ gases at a deposition temperature of 200° C., at a $NH_3/SiH_4$ gas flow rate ratio of 5, at a high frequency power density of 0.1 to 0.3 W/cm², at a pressure of 80 to 130 Pa, and with a thickness of 350 to 450 nm. Then, after the gas is temporarily exhausted, the step of introducing of an $H_2$ gas and of exhausting of the gas is repeated several times so as to prevent the gas used in the deposition of the silicon nitride film from being left.

After the gas is fully exhausted, the microcrystalline semiconductor layer 41 is deposited. In the first exemplary embodiment, the microcrystalline semiconductor layer 41 containing oxygen is deposited. The deposition of the microcrystalline semiconductor layer 41 is carried out under the following conditions: a deposition temperature of 200° C., a high frequency power density of 0.1 to 0.3 W/cm², a pressure of 100 to 200 Pa, and a flow rate ratio between an $H_2$ gas and an $SiH_4$ gas ($H_2/SiH_4$ ratio) of 250 to 350. Further, a $CO_2$ gas diluted with a rare gas such as He is introduced as an oxygen supply gas by 0.2 to 1.0% with respect to $SiH_4$, to thereby start plasma discharge. After a predetermined period of time, the supply of the $CO_2$ gas is interrupted, and the discharge is continuously performed so as to obtain a film thickness of 30 nm.

At this time, the flow rate of the $CO_2$ gas may be decreased stepwise. This makes it possible to deposit the microcrystalline semiconductor layer 41, the oxygen concentration of which decreases in the thickness direction of the microcrystalline semiconductor layer 41 from the interface with the gate insulating film 3. The oxygen concentration of the microcrystalline semiconductor layer 41 is determined depending on the period of time for introducing the $CO_2$ gas and the concentration of the $CO_2$ gas with respect to $SiH_4$. Thus, it is possible to make an adjustment such that oxygen is distributed at a higher concentration than nitrogen in the vicinity (about 10 to 15 nm) of the interface of the microcrystalline semiconductor layer 41 with the gate insulating film 3, which corresponds to a region in which a channel serving as a current path is formed. In this case, adjustment is made so that the maximum concentration of the oxygen contained in the microcrystalline semiconductor layer 41 becomes $1 \times 10^{21}$ $cm^{-3}$ or lower. The concentration of nitrogen introduced into the microcrystalline semiconductor layer 41 varies depending on the power density and pressure conditions when the microcrystalline semiconductor layer 41 is deposited. The reason is because the decomposition level of the Si—N bonds in the insulating film changes. Thus, by the period of time for introducing the $CO_2$ gas and the concentration of the $CO_2$ gas with respect to $SiH_4$, it is possible to make an adjustment such that oxygen is distributed at a higher concentration than nitrogen in the vicinity of the interface of the microcrystalline semiconductor layer 41 with the gate insulating film 3.

While the $CO_2$ gas is selected as the oxygen supply gas in this exemplary embodiment, an $N_2O$ gas, an $O_2$ gas, or the like may also be used. However, $O_2$ has a high reactivity with $SiH_4$, so if they react with each other within a gas pipe before being introduced into a chamber, an oxide formed by the reaction may causes the generation of foreign matter. Accordingly, when the $O_2$ gas is selected as the oxygen supply gas, it is important to prevent the $O_2$ gas from being mixed with $SiH_4$ before being introduced into the chamber. While He is used as the diluent gas, other rare gas may also be used. In the first exemplary embodiment, since the amount of rare gas introduced at the time of deposition is minute, the rare gas has no effect on the silicon crystallization rate and the like of the microcrystalline semiconductor layer 41. Moreover, there is no fear of damaging the interface with the gate insulating film 3 due to sputtering.

Thus, in the first exemplary embodiment, the use of at least a main component gas containing $SiH_4$ and $H_2$, and an oxygen supply gas diluted with at least one rare gas selected from the group consisting of $CO_2$, $N_2O$, and $O_2$ allows the microcrystalline semiconductor layer 41 to contain oxygen. The contained oxygen is combined with dangling bonds of nitrogen incorporated into the silicon site, thereby suppressing generation of electrons. That is, the use of oxygen, which is a hexavalent element, prevents a phenomenon in which free electrons are generated when the nitrogen diffused from the gate insulating film 3 of the lower layer is incorporated into the silicon crystal site upon deposition of the microcrystalline semiconductor layer 41 on the gate insulating film 3 by the plasma CVD method. As a result, the negative offset of the threshold voltage can be suppressed.

After the deposition of the microcrystalline semiconductor layer 41, the amorphous semiconductor layer 42 is deposited. In this case, the amorphous semiconductor layer 42 is deposited with a thickness of 130 to 150 nm under the following conditions: a deposition temperature of 200° C., a pressure of 150 to 300 Pa, a high frequency power of 0.02 to 0.06 W/cm², and an $H_2/SiH_4$ flow rate ratio of 3 to 5. The amorphous semiconductor layer 42 enables suppression of the OFF-state current of the TFT. Further, the amorphous semiconductor layer 42 can prevent impurities, which are introduced in a subsequent process or from ambient air, from entering the microcrystalline semiconductor layer 41, and can suppress deterioration of the microcrystalline semiconductor layer 41.

After the deposition of the amorphous semiconductor layer 42, the ohmic contact layer 6 is subsequently deposited. In this case, an n⁺-type a-Si film doped with phosphorus is formed as the ohmic contact layer 6. Specifically, the ohmic contact layer 6 is deposited with a thickness of 20 to 50 nm under the following conditions: a deposition temperature of 200° C., a pressure of 150 to 300 Pa, a high frequency power of 0.02 to 0.06 W/cm², and a gas flow rate ratio of $PH_3/SiH_4/H_2$=1:100:1600.

Figure 4B:
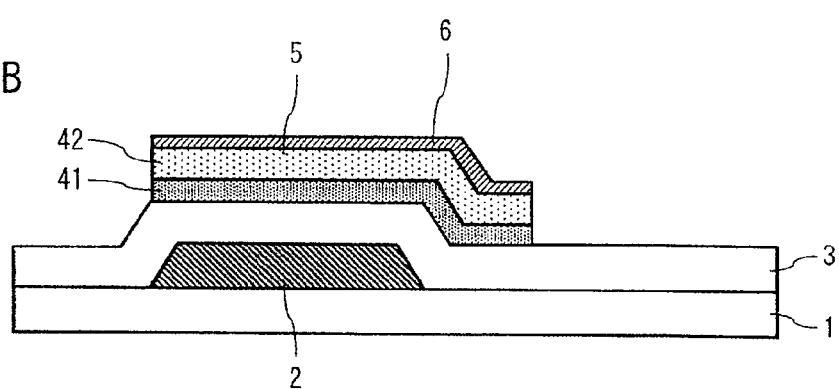

After that, a resist pattern of a desired shape is formed on the ohmic contact layer 6 by a photolithography process. Then, an etching process is carried out using the resist pattern as a mask, to thereby pattern the ohmic contact layer 6, the amorphous semiconductor layer 42, and the microcrystalline semiconductor layer 41. After that, the resist pattern is removed. Thus, as shown in FIG. 4B, the stacked film composed of the ohmic contact layer 6, the amorphous semiconductor layer 42, and the microcrystalline semiconductor layer 41 is patterned into an island shape.

Figure 5:
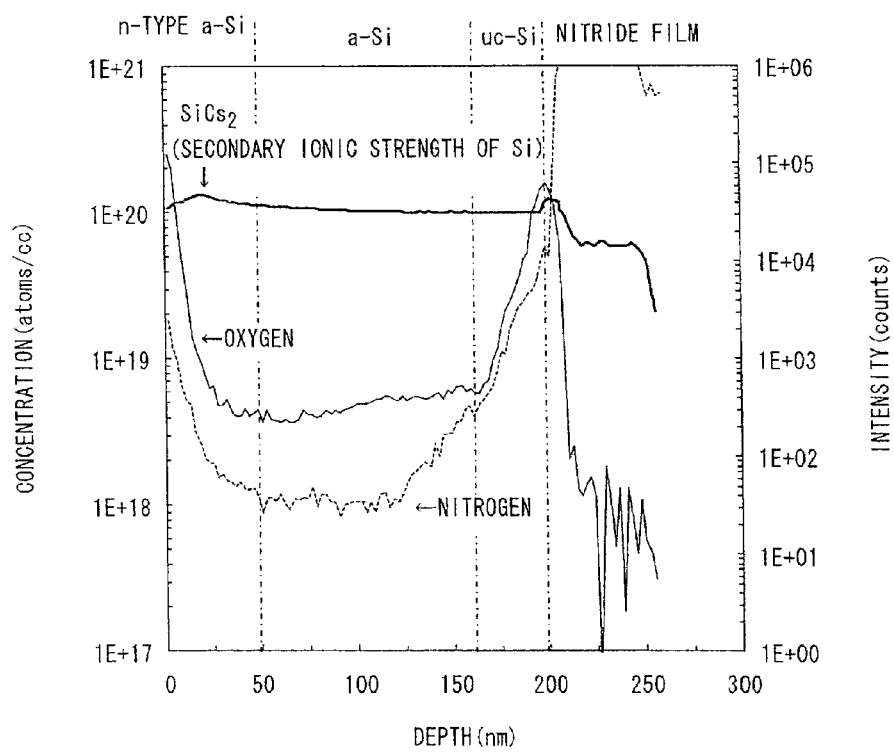
FIG. 5 is a profile representing a concentration distribution of oxygen and nitrogen measured by SIMS of the TFT according to the first exemplary embodiment.

FIG. 5 shows a concentration distribution of oxygen and nitrogen contained in the microcrystalline semiconductor layer 41 formed as described above. FIG. 5 is a profile showing the concentration distribution of oxygen and nitrogen measured by SIMS (Secondary Ion Mass Spectrometry) of the TFT according to the first exemplary embodiment. In the measurement by SIMS, IMS-6F manufactured by CAMECA is used and cesium is used as primary ions. The profile of FIG. 5 shows that 20 sccm of $CO_2$ gas diluted with He to 1000 ppm is added as an oxygen supply gas upon deposition of the microcrystalline semiconductor layer 41.

Note that, in FIG. 5, the nitride film indicates the gate insulating film 3, uc-Si indicates the microcrystalline semiconductor layer 41, a-Si indicates the amorphous semiconductor layer 42, and n-type a-Si indicates the ohmic contact layer 6. As shown in FIG. 5, the microcrystalline semiconductor layer 41 in the vicinity of the interface with the gate insulating film 3 is doped with oxygen at a concentration of about $2\times10^{20}$ cm⁻³. Meanwhile, the concentration of the nitrogen introduced in the microcrystalline semiconductor layer 41 in the vicinity of the interface with the gate insulating film 3 is about $6\times10^{19}$ cm⁻³. As is seen from FIG. 5, the concentration of the oxygen contained within a thickness range of 20 nm of the microcrystalline semiconductor layer 41 from the interface with the gate insulating film 3 is higher than that of nitrogen. Compared to the concentration of Si, the concentration of oxygen is extremely small. Accordingly, there is no possibility of forming a silicon oxide to be immobilized.

Next, conductive films serving as the source electrode 7a and the drain electrode 7b are deposited so as to cover the pattern of the stacked film composed of the ohmic contact layer 6, the amorphous semiconductor layer 42, and the microcrystalline semiconductor layer 41. As the conductive films serving as the source electrode 7a and the drain electrode 7b, a stacked film in which an Al—Si—Cu film is stacked on a Cr film may be used. In this case, a Cr film and an Al—Si—Cu film are sequentially deposited on the entire surface of the substrate 1 by a DC magnetron sputtering method or the like. The sputtering conditions for each film are as follows. The Cr film is deposited with a thickness of 50 nm under the following conditions: an Ar gas of 100 sccm, a pressure of 0.14 Pa, a DC power of 1.0 kw, and a temperature of 200° C. The Al—Si—Cu film is deposited with a thickness of about 300 nm under the following conditions: an Ar gas of 100 sccm, a pressure of 0.14 Pa, a DC power of 1.0 kw, and a temperature of 80° C.

Figure 4C:
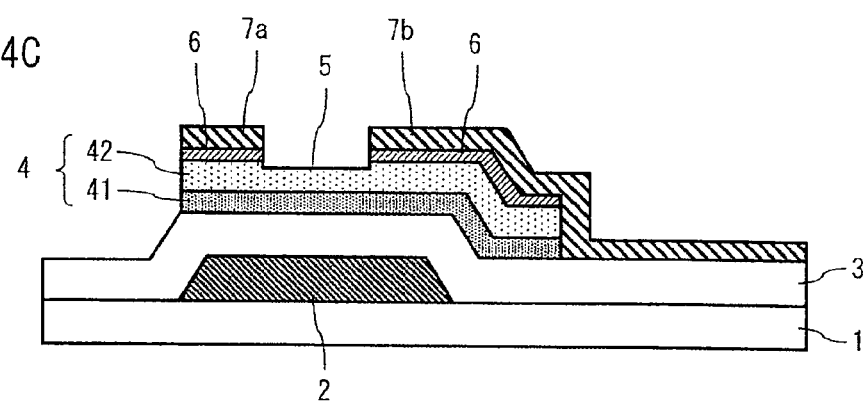

Subsequently, a resist pattern is formed on the deposited conductive films by a photolithography process. Then, an etching process is carried out using the resist pattern as a mask, to thereby pattern the conductive films into a desired shape. After that, the resist pattern is removed. As a result, as shown in FIG. 4C, the source electrode 7a and the drain electrode 7b are formed.

Next, an etching process is carried out using the source electrode 7a and drain electrode 7b thus formed as a mask. Specifically, a portion of the ohmic contact layer 6, which is exposed without being covered with the source electrode 7a or the drain electrode 7b, is entirely removed in the depth direction, and the amorphous semiconductor layer 42 formed under the portion is partially removed in the depth direction. That is, the stacked film composed of the ohmic contact layer 6, the amorphous semiconductor layer 42, and the microcrystalline semiconductor layer 41, which are patterned into an island shape, is etched by a predetermined amount using the source electrode 7a and the drain electrode 7b as a mask. As a result, as shown in FIG. 4C, a portion of the amorphous semiconductor layer 42 between the source electrode 7a and the drain electrode 7b is exposed. That is, the semiconductor layer 4 functioning as the channel region 5 is exposed between the source electrode 7a and the drain electrode 7b. Further, the ohmic contact layer 6 is separated into a source region and a drain region with the channel region 5 of the semiconductor layer 4 interposed therebetween.

In the above exemplary embodiment, the stacked film composed of the ohmic contact layer 6, the amorphous semiconductor layer 42, and the microcrystalline semiconductor layer 41 is etched by the predetermined amount using the source electrode 7a and the drain electrode 7b as a mask. Alternatively, the etching process may be carried out using the resist pattern used in the patterning of the source electrode 7a and the drain electrode 7b. Specifically, the stacked film composed of the ohmic contact layer 6, the amorphous semiconductor layer 42, and the microcrystalline semiconductor layer 41 may be etched by the predetermined amount in the state where the resist pattern used in the patterning of the source electrode 7a and the drain electrode 7b is left, and thereafter the resist pattern may be removed. The TFT according to the first exemplary embodiment is completed through the above-mentioned processes.

After that, when the pixel TFTs 86 for pixel switching are formed, the protective insulating film 8 for protecting the whole TFT elements is deposited on these layers. For instance, a silicon nitride film is deposited as the protective insulating film 8 on the entire surface of the substrate 1 by the plasma CVD method or the like. In this case, the silicon nitride film is deposited with a thickness of about 300 nm under the following conditions: a deposition temperature of 280° C., a high frequency power density of 0.1 to 0.3 W/cm², a pressure of 80 to 130 Pa, and a mixed gas of $N_2$, $SiH_4$, and $NH_3$ as a deposition gas. Subsequently, a resist pattern is formed on the protective insulating film 8 by a photolithography process. Then, an etching process for the protective insulating film 8 is carried out using the resist pattern as a mask, thereby forming the contact hole CH1 that reaches the drain electrode 7b. In the region corresponding to the contact hole CH1, the protective insulating film 8 is removed and the drain electrode 7b is exposed.

Figure 4D:
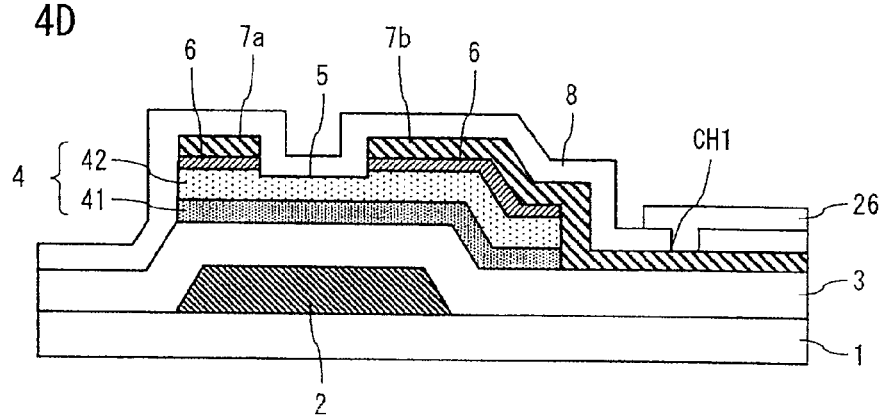

Next, a transparent conductive film is deposited on the protective insulating film 8 to form the pixel electrode 26. For instance, a transparent conductive film such as ITO is deposited on the entire surface of the substrate 1 by a sputtering method. Then, a resist pattern is formed on the deposited transparent conductive film by a photolithography process. Further, an etching process is carried out using the resist pattern as a mask, to thereby pattern the transparent conductive film into a desired shape. After that, the resist pattern is removed. As a result, as shown in FIG. 4D, the pixel electrode 26 which is connected to the drain electrode 7b through the contact hole CH1 is formed. Lastly, in order to alleviate the plasma damage during the manufacturing process, heat treatment is performed for 30 to 60 minutes at a temperature ranging from 250° C. to 300° C.

The components other than the pixel TFTs 86, such as the driving TFTs 87, the gate lines 89, the storage capacitor lines 91, the source lines 90, the storage capacitors 88, and the external terminals, are formed at the same time by the photolithography process and etching process as described above. The TFT array substrate 80 shown in FIG. 1 is completed through the above-mentioned processes and the like.

The TFT array substrate 80 manufactured as described above is bonded to an opposing substrate (not shown) having a color filter and an opposing electrode with a spacer interposed therebetween. Then, liquid crystals are injected into the gap, and the liquid crystal display panel sandwiching the liquid crystal layer is attached to the backlight unit. The liquid crystal display device of the first exemplary embodiment is completed through the above-mentioned processes and the like.

As described above, in the first exemplary embodiment, the addition of a minute amount of oxygen supply gas such as $N_2O$, $CO_2$, and $O_2$ to a main component gas containing $SiH_4$ and $H_2$ upon deposition of the microcrystalline semiconductor layer 41 allows the microcrystalline semiconductor layer 41 to contain oxygen. Further, the concentration of the oxygen contained in the microcrystalline semiconductor layer 41 in the vicinity (about 10 to 15 nm) of the interface with the gate insulating film 3, which is a region in which a channel serving as a current path is formed, is set to be higher than that of nitrogen. Consequently, the contained oxygen is combined with dangling bonds of nitrogen diffused from the gate electrode 3 of the lower layer, thereby preventing the phenomenon in which free electrons are generated. As a result, the negative offset of the threshold voltage can be suppressed. Additionally, in the first exemplary embodiment, the negative offset of the threshold can be suppressed while preventing an increase in optical leak current and an increase in OFF-state current, which are problems inherent in the countermeasures in the related art. Therefore, the present invention can be suitably applied to both the pixel TFT 86 and the driving TFT 87. In this manner, it is possible to provide a thin film transistor, a method of manufacturing the same, and a display device that are capable of achieving highly reliable electrical characteristics.

Moreover, upon deposition of the microcrystalline semiconductor layer 41, the flow rate of the oxygen supply gas is decreased stepwise, thereby making it possible to decrease the concentration of oxygen as the distance from the interface with the gate insulating film 3. As a result, an increase in the interface resistance between the microcrystalline semiconductor layer 41 and the amorphous semiconductor layer 42 can be suppressed, and a favorable ON-state current can be ensured.

<Second Exemplary Embodiment>

An exemplary structure of a TFT according to a second exemplary embodiment of the present invention will be described. The basic structure of the TFT according to the second exemplary embodiment is substantially the same as that of the first exemplary embodiment shown in FIG. 2, except that the gate insulating film 3 of the second exemplary embodiment is different from that of the first exemplary embodiment. Specifically, the gate insulating film 3 of the second exemplary embodiment is formed of a nitride film containing fluorine (F). In this case, the gate insulating film 3 is formed of a silicon nitride film containing fluorine.

The nitride film containing fluorine has a lower film density than a nitride film containing no fluorine like the gate insulating film 3 of the first exemplary embodiment. Accordingly, the amount of nitrogen contained in the gate insulating film 3 decreases. Further, when the silicon nitride film is used as the nitride film, Si—F bonds are formed due to the contained fluorine, with the result that Si—N bonds decrease. Thus, the amount of nitrogen contained in the gate insulating film 3 further decreases. In this manner, the amount of nitrogen contained in the gate insulating film 3 can be reduced by allowing the film to contain fluorine. Therefore, the amount of nitrogen contained in the microcrystalline semiconductor layer 41 can be reduced by diffusing it from the gate insulating film 3.

That is, in the second exemplary embodiment, the microcrystalline semiconductor layer 41 contains nitrogen at a concentration lower than that of the first exemplary embodiment. Accordingly, the microcrystalline semiconductor layer 41 contains oxygen at a concentration higher than that of nitrogen in at least the vicinity of the interface with the nitride film, as in the first exemplary embodiment, while the concentration of the oxygen may be lower than that of the first exemplary embodiment. In other words, while the upper limit and the lower limit are set for the concentration of the contained oxygen in the first exemplary embodiment, the lower limit of the concentration of oxygen is lowered by decreasing the amount of nitrogen diffused into the microcrystalline semiconductor layer 41 in the second exemplary embodiment. This results in further ensuring the process margin for manufacturing the device.

Further, as in the first exemplary embodiment, the microcrystalline semiconductor layer 41 contains oxygen such that the concentration of oxygen decreases as the distance from the interface with the gate insulating film 3. Accordingly, in the second exemplary embodiment, the increase in the interface resistance between the microcrystalline semiconductor layer 41 and the amorphous semiconductor layer 42 can be further suppressed as compared with the first exemplary embodiment. The other components of the TFT of the second exemplary embodiment are similar to those of the TFT of the first exemplary embodiment shown in FIG. 2, so the description thereof is omitted.

Next, a method of manufacturing the TFT according to the second exemplary embodiment will be described. First, as with the first exemplary embodiment, the gate electrode 2 is formed into a desired shape on the substrate 1. Next, the gate insulating film 3, the microcrystalline semiconductor layer 41, the amorphous semiconductor layer 42, and the ohmic contact layer 6 are deposited in this order so as to cover the gate electrode 2. These layers are deposited on the entire surface of the substrate 1 by a plasma CVD method or the like. The gate insulating film 3 may be formed of a nitride film such as a silicon nitride film. Further, for example, the microcrystalline semiconductor layer 41 may be formed of i-type uc-Si, the amorphous semiconductor layer 42 may be formed of i-type a-Si, and the ohmic contact layer 6 may be formed of $n^+$-type a-Si.

First, a silicon nitride film is deposited as the gate insulating film 3. The second exemplary embodiment has a feature that a fluorine-containing gas (fluorine compound gas) containing $SiF_4$, $C_2F_6$, $C_3F_8$, $SF_6$, $CF_4$, or the like are added to a mixed gas of main component gasses of $SiH_4$, $NH_3$, and $N_2$ upon deposition of the gate insulating film 3 by the plasma CVD method or the like. When these fluorine-containing gasses are added by a minute amount to $SiH_4$, the dielectric constant of the formed silicon nitride film decreases. It is known that the dielectric constant and the film density of an insulating film are associated with each other, and that the density thereof decreases as the dielectric constant decreases.

Upon deposition of the silicon nitride film using a plasma method, the introduced $SiH_4$ and $NH_3$ are decomposed in the plasma, thereby generating $SiH_2$ ($NH_2$) and $SiH_3$ as deposition precursors. It is considered that the deposition precursors are diffused into the substrate and react with each other, thereby forming an SiN film. Meanwhile, when the fluorine-containing gas is added, a radical of fluorine (F) reacts with the precursors, which inhibits reaction between $SiH_2$ ($NH_2$) and $SiH_3$. For this reason, it is estimated that the amount of N and Si contained per unit volume decreases, with the result that an SiN film having a low density is obtained. At this time, Si—F bonds are partially formed. Thus, the film density becomes lower and the Si—F bonds are formed, so that the amount of nitrogen contained in the nitride film decreases.

Figure 6:
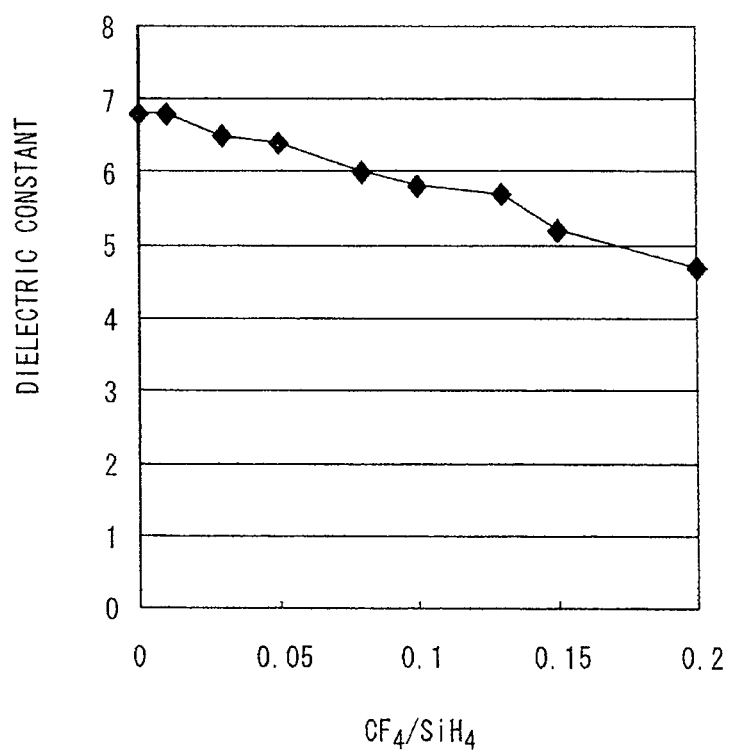
FIG. 6 shows a change in dielectric constant of an SiN film to be deposited, when the amount of added $CF_4$ gas is changed with respect to the flow rate of an $SiH_4$ gas.

FIG. 6 shows a change in dielectric constant of an SiN film to be deposited, when the amount of added $CF_4$ gas is changed with respect to the flow rate of an $SiH_4$ gas. As is seen from FIG. 6, as the amount of the added $CF_4$ gas with respect to the flow rate of the $SiH_4$ gas increases, the dielectric constant of the SiN film to be deposited decreases. This is because the film density decreases and the concentration of nitrogen contained in the SiN film decreases as the amount of the added $CF_4$ gas with respect to the flow rate of the $SiH_4$ gas increases. In other words, as the flow rate of the fluorine-containing gas is increased, the deposited film becomes porous. In view of this, if nitrogen is in a state of being easily diffused into the microcrystalline semiconductor layer 41, the flow rate of the fluorine-containing gas can be adjusted as needed depending on the state. In short, the flow rate of the fluorine-containing gas to be added upon deposition of the gate insulating film 3 may be adjusted as needed according to the concentration of the nitrogen diffused into the microcrystalline semiconductor layer 41. However, if the amount of the added fluorine-containing gas is excessively large, the etching effect appears strongly, so that a defect starts to occur within the film. Further, it is necessary to take care so that the uniformity of the thickness is not deteriorated.

For instance, the silicon nitride film containing fluorine is deposited with a thickness of about 350 to 400 nm under the following deposition conditions: a $CF_4$ gas is added by 10% to $SiH_4$ gas; an $NH_3/SiH_4$ ratio of 5; a pressure of 80 to 130 Pa; and an RF power density of 0.3 to 0.8 $W/cm^2$. In order to control the film quality such as stress, $H_2$ or He may be added to a mixed gas of $SiH_4$, $NH_3$, and $N_2$ which are main component gasses used to deposit the gate insulating film 3. The power density is set to be higher than that of the first exemplary embodiment, because the fluorine-containing gas is difficult to be decomposed. The dielectric constant of the SiN film containing fluorine to be deposited at this time is about 5.8, which is lower than the dielectric constant 6.8 of the SiN film of the first exemplary embodiment. Then, after the gas is temporarily exhausted, the step of introducing and exhausting the $H_2$ gas is repeated several times.

After the gas is fully exhausted, the microcrystalline semiconductor layer 41, the amorphous semiconductor layer 42, and the ohmic contact layer 6 are successively deposited in the same manner as in the first exemplary embodiment. Through the photolithography process and etching process, the stacked film composed of the ohmic contact layer 6, the amorphous semiconductor layer 42, and the microcrystalline semiconductor layer 41 is patterned into an island shape. The subsequent processes are similar to those of the first exemplary embodiment, so the description thereof is omitted.

Figure 7:
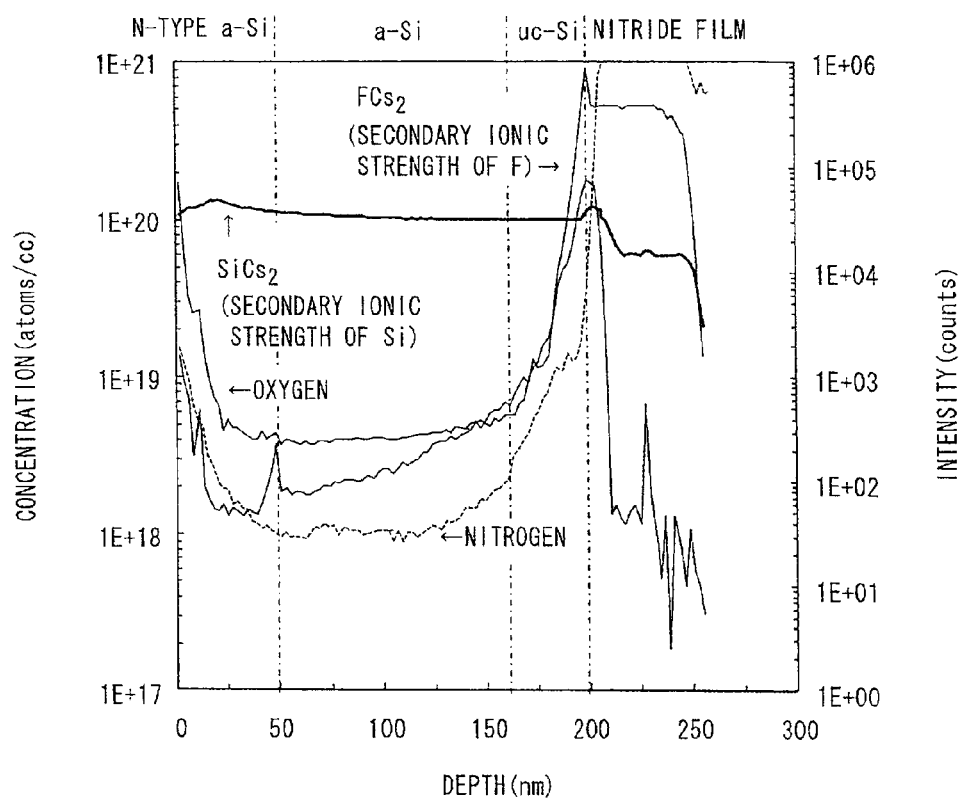
FIG. 7 is a profile representing a concentration distribution of oxygen and nitrogen measured by SIMS of a TFT according to a second exemplary embodiment of the present invention.

FIG. 7 shows a concentration distribution of oxygen and nitrogen contained in the microcrystalline semiconductor layer 41 formed as described above. FIG. 7 is a profile representing the concentration distribution of oxygen and nitrogen measured by SIMS of the TFT according to the second exemplary embodiment. FIG. 7 also shows a profile representing secondary ions of fluorine, as well as the profile representing the concentration distribution of oxygen and nitrogen.

As shown in FIG. 7, the concentration of nitrogen contained in the microcrystalline semiconductor layer 41 in the vicinity of the interface with the gate insulating film 3 is about $1.6 \times 10^{19}$ $cm^{-3}$. In comparison with the profile representing the concentration distribution of the first exemplary embodiment shown in FIG. 5, it is obvious that the diffusion of nitrogen into the microcrystalline semiconductor layer 41 is suppressed in the second exemplary embodiment. Further, fluorine is also diffused into the microcrystalline semiconductor layer 41.

It is considered that no defect occurs in the gate insulating film 3 due to the addition of fluorine, since there is no problem with the reliability of the TFT of the second exemplary embodiment. In Japanese Unexamined Patent Application Publication No. 2007-221137, a plasma process is carried out on a nitride film using an $SiF_4$ gas. As a result, it is expected that the nitride film containing fluorine (which is referred to as "intermediate layer" in Japanese Unexamined Patent Application Publication No. 2007-221137) is to be formed as in the second exemplary embodiment. However, in Japanese Unexamined Patent Application Publication No. 2007-221137, plasma damage remains on the uppermost surface of the intermediate layer due to the change of the surface of the nitride film in the subsequent process, and thus a defect is liable to occur at the gate interface. Meanwhile, in the second exemplary embodiment, a porous SiN film can be formed while suppressing the occurrence of a defect by adding fluorine at the time of deposition. The formation of the porous SiN film and the decrease of Si—N bonds due to the formation of Si—F bonds lead to a reduction in the amount of nitrogen contained in the gate insulating film 3. As a result, the amount of nitrogen diffused into the microcrystalline semiconductor layer 41 can be reduced.

As described above, in the second exemplary embodiment, the gate insulating film 3 containing fluorine is deposited using a main component gas containing $SiH_4$, $NH_3$, and $N_2$, and at least one fluorine-containing gas selected from the group consisting of $SiF_4$, $C_2F_6$, $C_3F_8$, $SF_6$, and $CF_4$. This makes it possible to reduce the amount of nitrogen contained in the gate insulating film 3, and to suppress the diffusion of nitrogen into the microcrystalline semiconductor layer 41. Accordingly, as with the first exemplary embodiment, the negative offset of the threshold voltage can be suppressed without causing an increase in the optical leak current and an increase in the OFF-state current. Therefore, the present invention can be suitably applied to both the pixel TFT 86 and the driving TFT 87. Thus, it is possible to provide a thin film transistor, a method of manufacturing the same, and a display device that are capable of achieving highly reliable electrical characteristics.

Also, in the second exemplary embodiment, it is possible to reduce the concentration of oxygen contained in the microcrystalline semiconductor layer 41. Therefore, it is possible to suppress the increase in the interface resistance between the microcrystalline semiconductor layer 41 and the amorphous semiconductor layer 42, and to achieve the processes with a margin for manufacturing products. Moreover, it is considered that no defect occurs in the gate insulating film 3 due to the addition of fluorine, since there is no problem with the reliability.

Figure 8:
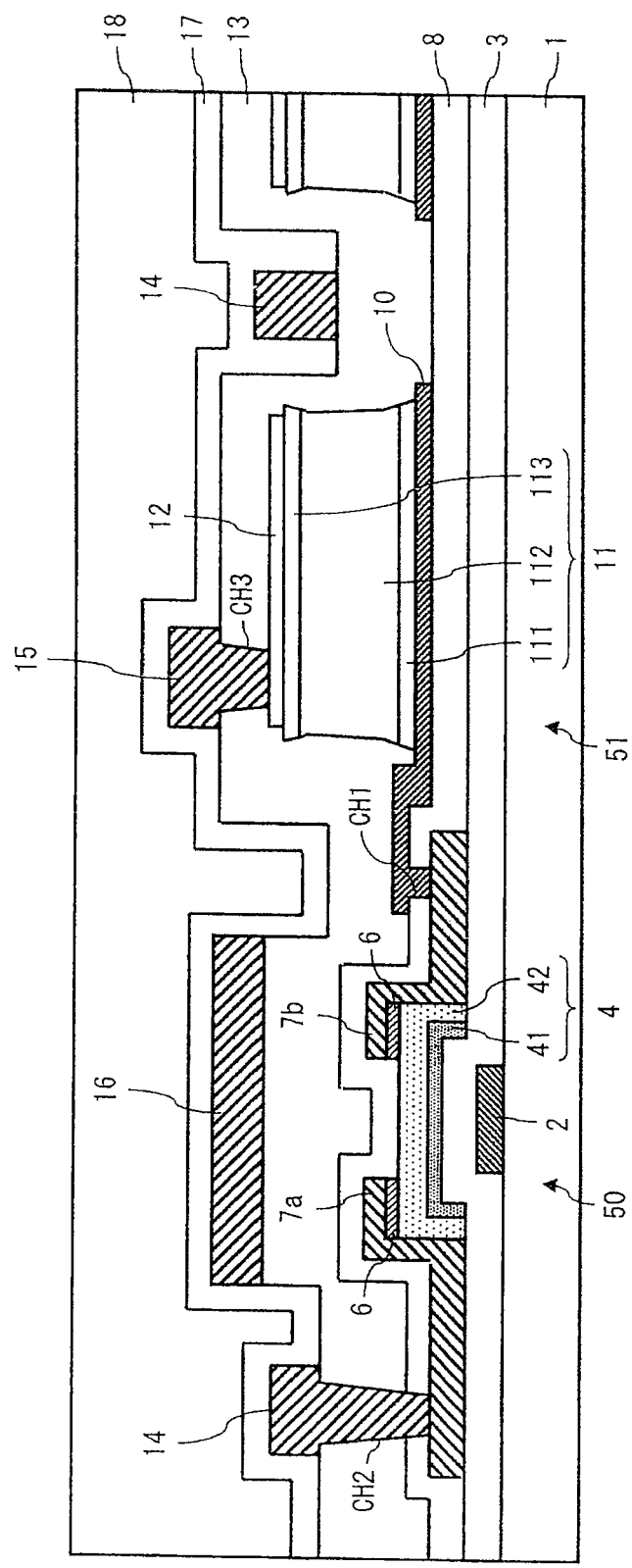
FIG. 8 is a sectional view showing an exemplary structure of a TFT array substrate including a photosensor integrated therein according to the second exemplary embodiment.

The use of the microcrystalline semiconductor TFT according to the second exemplary embodiment for a TFT array substrate including a photosensor integrated therein, for example, can increase the S/N ratio (signal/noise ratio) and secure the dynamic range. The TFT array substrate including a photosensor integrated therein is used for a photoelectric conversion device such as a liquid crystal display device including a photosensor integrated therein, for example. In such a photoelectric conversion device, driving TFTs for driving elements provided within the photosensor and the like are used in addition to TFTs for driving display signals. The microcrystalline semiconductor TFT of the second exemplary embodiment can also be applied to such driving TFTs. Referring now to FIG. 8, the structure of the TFT array substrate including a photosensor integrated therein is described. FIG. 8 is a sectional view showing the structure of the TFT array substrate including the photosensor integrated therein according to the second exemplary embodiment.

As shown in FIG. 8, a TFT 50 according to the second exemplary embodiment is formed on the transparent insulating substrate 1 such as a glass substrate. Specifically, the gate electrode 2 is formed on the substrate 1, and the gate insulating film 3 including a nitride film containing fluorine is formed so as to cover the gate electrode 2. Further, the semiconductor layer 4 is formed on the gate insulating film 3. The semiconductor layer 4 includes the microcrystalline semiconductor layer 41 containing oxygen, and the amorphous semiconductor layer 42 stacked on the microcrystalline semiconductor layer 41. Furthermore, the source electrode 7a and the drain electrode 7b are formed above the semiconductor layer 4 through the ohmic contact layer 6.

The protective insulating film 8 is formed as a first passivation film so as to cover the inverted staggered microcrystalline semiconductor TFT 50 structured as described above. The protective insulating film 8 may be formed of an oxide film.

More preferably, the protective insulating film 8 is formed of a silicon nitride film containing fluorine, like the gate insulating film 3. Further, a photodiode 51 is formed on the protective insulating film 8. The photodiode 51 includes a lower electrode 10, a photoelectric conversion layer 11, and an upper electrode 12.

The lower electrode 10 is formed on the protective insulating film 8 so as to be connected to the drain electrode 7b through the contact hole CH1 formed in the protective insulating film 8. The photoelectric conversion layer 11 is formed on the lower electrode 10. The photoelectric conversion layer 11 has a three-layered structure in which an n-type a-Si film 111 and an i-type a-Si film 112, which are doped with phosphorus (P) or the like, and a p-type a-Si film 113, which is doped with boron (B) or the like, are sequentially stacked from the substrate 1 side, for example. The upper electrode 12, which is a transparent electrode containing indium oxide, is formed on the photoelectric conversion layer 11. The photodiode 51 structured as described above converts received light into electric charge.

A second passivation film 13 is formed so as to cover the upper electrode 12, the photoelectric conversion layer 11, and the lower electrode 10. The second passivation film 13 is formed on substantially the entire surface of the substrate 1 so as to cover the photodiode 51 and the TFT 50. Furthermore, a contact hole CH2 that reaches the source electrode 7a and a contact hole CH3 that reaches the upper electrode 12 are formed in the surface of the second passivation film 13.

A data line 14 connected to the source electrode 7a via the contact hole CH2 is formed on the second passivation film 13. Further, a bias line 15 connected to the upper electrode 12 via the contact hole CH3 is formed on the second passivation film 13. The data line 14 and the bias line 15 are each formed of a metallic material. The data line 14 is a wire for reading out the electric charge obtained through conversion by the photodiode 51. The bias line 15 supplies a reverse bias to the photodiode 51 so as to produce an OFF state when no light is applied. Further, on the second passivation film 13, a light-shielding layer 16 for shielding of the TFT 50 is formed. The light-shielding layer 16 is formed in the same layer as the data line 14 and the bias line 15.

A third passivation film 17 is formed so as to cover the data line 14, the bias line 15, and the light-shielding layer 16. Further, a fourth passivation film 18 is formed on the third passivation film 17. The fourth passivation film 18 is a planarized film and made of an organic resin, for example.

Thus, in the TFT array substrate including the photosensor integrated therein using the TFT 50 of the second exemplary embodiment, among the lower insulating films (the first passivation film and the second passivation film 13) positioned below the upper electrode 12, at least the protective insulating film 8 serving as the first passivation film is formed of an SiN film which contains fluorine and has a low dielectric constant. Accordingly, the coupling capacitance between the photodiode 51 and the lower insulating film decreases, and the S/N ratio of the sensor increases. This results in reduction of noise. Consequently, it is possible to achieve improvement in the offset of the microcrystalline semiconductor TFT 50 and noise reduction in the photodetector.

<Third Exemplary Embodiment>

Figure 9:
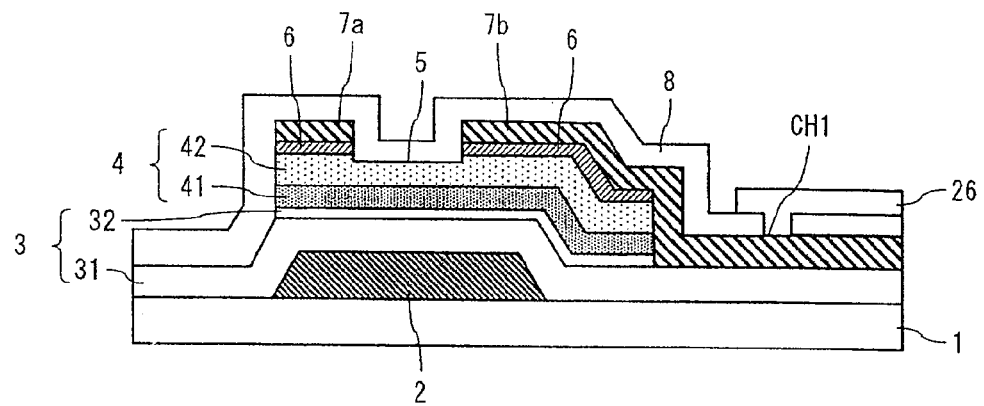
FIG. 9 is a sectional view showing an exemplary structure of a TFT according to a third exemplary embodiment of the present invention.

An exemplary structure of a TFT according to a third exemplary embodiment of the present invention will be described with reference to FIG. 9. FIG. 9 is a sectional view showing the structure of the TFT according to the third exemplary embodiment. In the second exemplary embodiment, the gate insulating film 3 is a single nitride film containing fluorine. Meanwhile, in the third exemplary embodiment, the gate insulating film 3 is a stacked film including a nitride film containing fluorine. The third exemplary embodiment differs from the second exemplary embodiment only in the structure of the gate insulating film 3. The other components are similar to those of the second exemplary embodiment, so the description thereof is omitted.

As shown in FIG. 9, the gate insulating film 3 includes a first nitride film 31 which contains no fluorine, and a second nitride film 32 which contains fluorine and is formed on the first nitride film 31. That is, the gate insulating film 3 has a stacked structure in which the second nitride film 32 containing fluorine is stacked on the first nitride film 31 containing no fluorine. The first nitride film 31 is formed on substantially the entire surface of the substrate 1 so as to cover the gate electrode 2. On the other hand, the second nitride film 32 has substantially the same shape as the microcrystalline semiconductor layer 41, and is formed only on a part of the first nitride film 31. Further, the semiconductor layer 4 is formed on the second nitride film 32. That is, the second nitride film 32 is formed between the first nitride film 31 and the microcrystalline semiconductor layer 41. In this case, the first nitride film 31 is formed of a silicon nitride film which contains no fluorine and has a thickness of about 300 to 350 nm, for example. Further, the second nitride film 32 is formed of a silicon nitride film which contains fluorine and has a thickness of about 50 to 100 nm, for example.

Thus, the gate insulating film 3 includes the second nitride film 32 which contains fluorine and is formed in a portion in contact with the microcrystalline semiconductor layer 41. Therefore, the amount of nitrogen contained in the gate insulating film 3 in the vicinity of the interface with the microcrystalline semiconductor layer 41 can be reduced. Accordingly, as with the second exemplary embodiment, the amount of nitrogen contained in the microcrystalline semiconductor layer 41 due to the diffusion from the gate insulating film 3 can be reduced.

Further, the second nitride film 32 containing fluorine is stacked on the porous first nitride film 31 containing no fluorine can suppress degradation of the dielectric constant of the gate insulating film 3 caused by the use of the nitride film containing fluorine. This improves the gate breakdown voltage as compared with the second exemplary embodiment. The gate breakdown voltage of the gate insulating film 3 can be set to a desired value by appropriately adjusting the thicknesses of the first nitride film 31 and the second nitride film 32.

Furthermore, in the structure according to the third exemplary embodiment, a metal having a low corrosion resistance, such as Al or an Al alloy, which is hardly selected as material in the second exemplary embodiment, can be used as the material of the source electrode 7a and the drain electrode 7b. The reason for this will be described later. Accordingly, a TFT having a low wiring resistance and capable of high-speed response can be achieved.

Next, a method of manufacturing the TFT according to the third exemplary embodiment will be described. First, as with the second exemplary embodiment, the gate electrode 2 is formed into a desired shape on the substrate 1. Then, in the third exemplary embodiment, the first nitride film 31 and the second nitride film 32 are deposited in this order as the gate insulating film 3 so as to cover the gate electrode 2. These films are deposited on the entire surface of the substrate 1 by a plasma CVD method or the like. As the first nitride film 31, a nitride film such as a silicon nitride film containing no fluorine may be used. As the second nitride film 32, a nitride film such as a silicon nitride film containing fluorine may be used. In this case, the first nitride film 31 is deposited under the same conditions as those for the gate insulating film 3 of the first exemplary embodiment. Further, the second nitride film 32 is deposited under the same conditions for the gate insulating film 3 of the second exemplary embodiment.

After the deposition of the second nitride film 32, the microcrystalline semiconductor layer 41, the amorphous semiconductor layer 42, and the ohmic contact layer 6 are deposited in this order in the same manner as in the second exemplary embodiment. After that, a resist pattern of a desired shape is formed on the ohmic contact layer 6 by a photolithography process. Then, an etching process is carried out using the resist pattern as a mask, to thereby pattern the ohmic contact layer 6, the amorphous semiconductor layer 42, the microcrystalline semiconductor layer 41, and the second nitride film 32 in the third exemplary embodiment. That is, in the third exemplary embodiment, the etching process is carried out so as to completely etch the ohmic contact layer 6, the amorphous semiconductor layer 42, and the microcrystalline semiconductor layer 41, as well as the second nitride film 32 formed thereunder. After that, the resist pattern is removed. As a result, the stacked film composed of the ohmic contact layer 6, the amorphous semiconductor layer 42, the microcrystalline semiconductor layer 41, and the second nitride film 32 is patterned into an island shape.

In this manner, the removal of the exposed portion of the second nitride film 32 prevents corrosion in the subsequent process due to fluorine of an Al-based wire. That is because fluorine generates hydrofluoric acid in a wet process, rinsing, or the like during process steps, resulting in corrosion of a metal wire having a low corrosion resistance such as Al. For this reason, the second nitride film 32 containing fluorine has a risk of corrosion of a metal wire having a low corrosion resistance such as Al. However, in the third exemplary embodiment, the removal of the exposed portion of the second nitride film 32 prevents the corrosion due to fluorine of an Al-based wire in the subsequent process.

Next, conductive films serving as the source electrode 7a and the drain electrode 7b are deposited so as to cover the pattern of the stacked film composed of the ohmic contact layer 6, the amorphous semiconductor layer 42, the microcrystalline semiconductor layer 41, and the second nitride film 32. In the third exemplary embodiment, a metal having a low resistance and a low corrosion resistance, such as Al or an Al alloy, can be used for the conductive films of the source electrode 7a and the drain electrode 7b, for the reason mentioned above. As a matter of course, other metals may also be used. Through the photolithography process and etching process, the deposited conductive films are pattered into a desired shape, thereby forming the source electrode 7a and the drain electrode 7b. The subsequent processes are similar to those of the first and second exemplary embodiments, so the description thereof is omitted.

As described above, the gate insulating film 3 formed in the third exemplary embodiment includes the first nitride film 31 containing no fluorine and the second nitride film 32 which is formed on the first nitride film 31 in a portion in contact with the microcrystalline semiconductor layer 41 and which contains fluorine. This makes it possible to reduce the amount of nitrogen contained in the gate insulating film 3 in the vicinity of the interface with the microcrystalline semiconductor layer 41, and to suppress the diffusion of nitrogen into the microcrystalline semiconductor layer 41. Accordingly, as with the first and second exemplary embodiments, the negative offset of the threshold voltage can be suppressed without causing an increase in the optical leak current and an increase in the OFF-state current. Consequently, it is possible to provide a thin film transistor, a method of manufacturing the same, and a display device that are capable of achieving highly reliable electrical characteristics.

Further, as with the second exemplary embodiment, the concentration of oxygen contained in the microcrystalline semiconductor layer 41 can be reduced. This makes it possible to suppress an increase in the interface resistance between the microcrystalline semiconductor layer 41 and the amorphous semiconductor layer 42, and to achieve the processes with a margin for manufacturing products. Furthermore, in the third exemplary embodiment, the use of the nitride film containing fluorine as a part of the gate insulating film 3 can suppress degradation of the dielectric constant of the gate insulating film 3 and improve the gate breakdown voltage as compared with the second exemplary embodiment. Moreover, upon formation of the source electrode 7a and the drain electrode 7b, the second nitride film 32 is not exposed to the surface. Accordingly, a metal having a low corrosion resistance, such as Al or an Al alloy, can be used. Therefore, a TFT having a low wiring resistance and capable of high-speed response can be achieved.

While the third exemplary embodiment shows an exemplary structure of the gate insulating film 3 formed of a stacked film including a nitride film containing fluorine, any structure may be employed as long as the nitride film 32 containing fluorine is formed in at least a portion in contact with the microcrystalline semiconductor layer 41. For instance, when a metal wire having a low corrosion resistance is not used as the source electrode 7a and the drain electrode 7b, the second nitride film 32 may be replaced with the gate insulating film 3 stacked on substantially the entire surface of the first nitride film 31.

<Fourth Exemplary Embodiment>

An exemplary structure of a TFT according to a fourth exemplary embodiment of the present invention will be described. The basic structure of the TFT according to the fourth exemplary embodiment is substantially the same as that of the first exemplary embodiment shown in FIG. 2, except that the gate insulating film 3 and the microcrystalline semiconductor layer 41 of the fourth exemplary embodiment differ from those of the first exemplary embodiment.

Specifically, in the fourth exemplary embodiment, the gate insulating film 3 is formed of an SiN film having an N/Si composition ratio of 1.0 or less. Note that the gate insulating film 3 of the fourth exemplary embodiment contains no fluorine, unlike the second and third exemplary embodiments. The N/Si composition ratio of a typical nitride film is 1.3, and the N/Si ratio of the SiN film used for the gate insulating film 3 in the first exemplary embodiment is about 1.3. In the fourth exemplary embodiment, the amount of nitrogen contained in the gate insulating film 3 can be reduced by using an SiN film having an N/Si composition ratio of 1.0 or less, which is lower than that of the first exemplary embodiment, as the gate insulating film 3. Accordingly, the diffusion of nitrogen into the microcrystalline semiconductor layer 41 can be effectively suppressed.

That is, in the fourth exemplary embodiment, the microcrystalline semiconductor layer 41 contains nitrogen at a concentration lower than that of the first exemplary embodiment. The microcrystalline semiconductor layer 41 of the fourth exemplary embodiment contains about the normal level of oxygen, and does not necessarily contain oxygen at an extremely high level as in the first exemplary embodiment.

Figure 10:
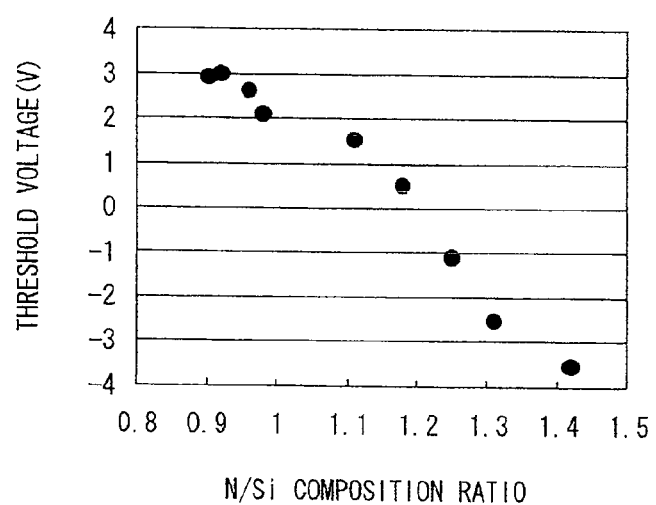
FIG. 10 is a graph showing a relationship between an N/Si composition ratio of a gate insulating film and a threshold voltage of the TFT.

Referring now to FIG. 10, a change in threshold voltage of the TFT when the N/Si composition ratio of the gate insulating film 3 is decreased will be described. FIG. 10 is a graph showing the relationship between the N/Si composition ratio of the gate insulating film 3 and the threshold voltage of the TFT. As is seen from FIG. 10, when the gate insulating film 3 having an N/Si composition ratio of 1.0 or less is used, the threshold voltage of the TFT is in the range of about 2 to 3 V. When the threshold voltage is 2 V or higher, the source-drain current obtained when Vg=0 V is as low as about $10^{-5}$ times the source-drain current value obtained when Vg=20 V. Thus, the driving TFT 87 can be used for a driving circuit.

Figure 11:
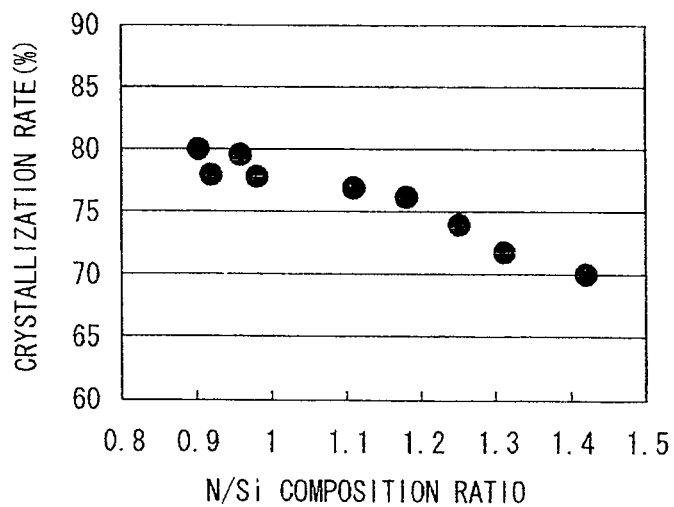
FIG. 11 is a graph showing a relationship between the N/Si composition ratio of the gate insulating film and a crystallization rate of a microcrystalline semiconductor layer formed on the gate insulating film.

The inventors have found that when the N/Si composition ratio of the gate insulating film 3 is decreased, the crystallization rate of the microcrystalline semiconductor layer 41 formed on the gate insulating film 3 is improved. The reasons for this will be described below with reference to FIG. 11. FIG. 11 is a graph showing the relationship between the N/Si composition ratio of the gate insulating film 3 and the crystallization rate of the microcrystalline semiconductor layer 41 formed on the gate insulating film 3. The crystallization rate shown in FIG. 11 is calculated from measurements by laser Raman. A specific method for calculating the crystallization rate is as follows. When the microcrystalline semiconductor layer 41 is made of microcrystalline silicon, for example, in the measurements by laser Raman, a crystal Si peak (Ic) appears in the vicinity of 520 $cm^{-1}$, a Si grain boundary peak (Ib) appears in the vicinity of 505 $cm^{-1}$, and an a-Si peak (Ia) appears in the vicinity of 480 $cm^{-1}$. The height of each peak is substituted into the formula (1) to obtain the crystallization rate as follows.

$$\text{Crystallization Rate} = (Ic+Ib)/(Ic+Ib+Ia) \times 100(\%) \quad (1)$$

As is seen from FIG. 11, the crystallization rate of the microcrystalline semiconductor layer 41 increases as the N/Si composition ratio of the SiN film decreases. The crystallization rate of the microcrystalline semiconductor layer 41 tends to be saturated when the N/Si composition ratio of the SiN film decreases to about 1.0. The reason that the crystallization rate increases as the N/Si composition ratio decreases seems to be as follows. That is, as the N/Si composition ratio decreases, the amount of nitrogen with respect to silicon decreases, resulting in increase of dangling bonds of silicon. It is also considered that the dangling bonds act as crystalline nuclei upon formation of the microcrystalline semiconductor layer 41.

Thus, in the fourth exemplary embodiment, the use of the SiN film having an N/Si composition ratio of 1.0 or less as the gate insulating film 3 can suppress the diffusion of nitrogen into the microcrystalline semiconductor layer 41 and improve the crystallization rate of the microcrystalline semiconductor layer 41.

Figure 12:
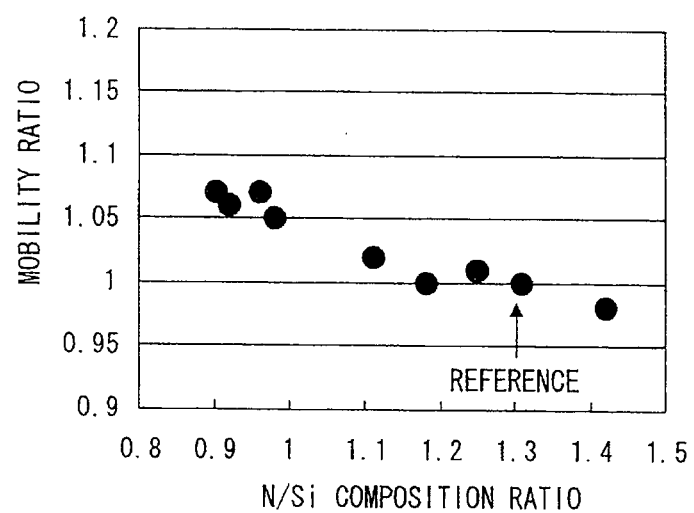
FIG. 12 is a graph showing a relationship between the N/Si composition ratio of the gate insulating film and a mobility of the TFT.

Referring now to FIG. 12, an increase or decrease in mobility of the TFT formed by changing the N/Si composition ratio of the gate insulating film 3 will be described. FIG. 12 is a graph showing the relationship between the N/Si composition ratio of the gate insulating film and the mobility of the TFT. FIG. 12 shows a ratio of a mobility at a different N/Si composition ratio to a reference value which represents a mobility when the N/Si composition ratio is 1.3. As the microcrystalline semiconductor layer 41 of the TFT, one containing about the normal level of oxygen is used, as described above.

As is seen from FIG. 12, when the N/Si composition ratio is lower than 1.1, the mobility of the TFT becomes higher than that when the N/Si ratio is 1.3. That is, as with the fourth exemplary embodiment, when a film having an N/Si composition ratio decreased to 1.0 or less from the normal value is used as the gate insulating film 3, the mobility of the TFT can be increased. Thus, in the fourth exemplary embodiment, the use of the SiN film having an N/Si composition ratio of 1.0 or less as the gate insulating film 3 can improve the crystallization rate of the microcrystalline semiconductor layer 41, with the result that the mobility of the TFT can be increased.

Figure 13:
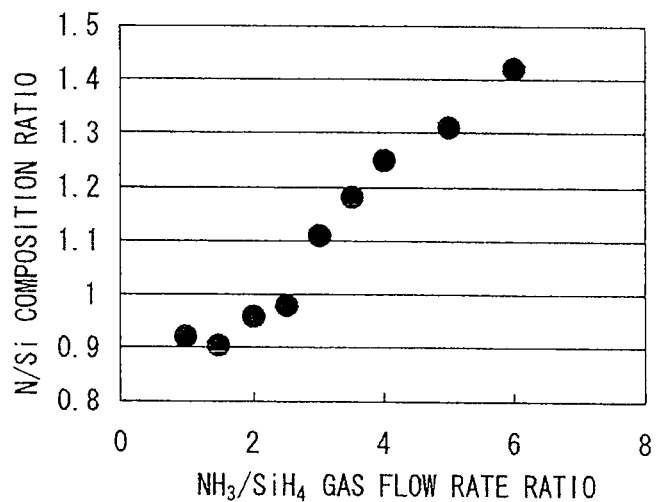
FIG. 13 is a graph showing a relationship between an $NH_3/SiH_4$ gas flow rate ratio and an N/Si ratio of an SiN film to be deposited.

In order to form an SiN film having an N/Si composition ratio of 1.0 or less as the gate insulating film 3, the gate insulating film 3 may be formed under deposition conditions different from those of the first exemplary embodiment. Specifically, the $NH_3/SiH_4$ gas flow rate ratio may be set to be different from that of the first exemplary embodiment. When the flow rate ratio of $SiH_4$ and $NH_3$ in the mixed gas of $N_2$, $SiH_4$, and $NH_3$, which are main component gasses used to deposit the SiN film, is changed, the N/Si composition ratio of the SiN film to be deposited can be changed. FIG. 13 is a graph showing the relationship between the $NH_3/SiH_4$ gate flow rate ratio and the N/Si ratio of the SiN film to be deposited. In the graph shown in FIG. 13, other deposition parameters are as follows: a pressure of 130 Pa, an RF power density of 0.2 $W/cm^2$, and a temperature of 200° C.

As is seen from FIG. 13, as the $NH_3/SiH_4$ gas flow rate ratio decreases, the N/Si composition ratio decreases and the concentration of nitrogen contained in the SiN film decreases. Further, as the $NH_3/SiH_4$ flow rate ratio becomes smaller than 2, the N/Si composition ratio tends to be saturated at about 0.94 to 1.0. Accordingly, in order to deposit the SiN film having an N/Si composition ratio of 1.0 or less as the gate insulating film 3, the $NH_3/SiH_4$ gas flow rate ratio may be set to 2 or less. Thus, in the fourth exemplary embodiment, the amount of nitrogen contained in the SiN film can be reduced without using the method of adding fluorine as in the second and third exemplary embodiments.

The N/Si composition ratio can be further reduced by changing the deposition method or gases to be selected. For instance, when the SiN film is deposited using only $SiH_4$ and $N_2$ without using $NH_3$, the N/Si composition ratio can be reduced to 0.5 or less. Note that the resistivity of the SiN film is associated with the N/Si composition ratio. That is, it is known that as the N/Si composition ratio decreases, the resistivity of the SiN film decreases and the insulation properties decrease. When the N/Si composition ratio of the SiN film is in the range of 0.9 to 1, the resistivity shows sufficient insulation properties of $5\times10^{11}$ Ωcm or more. Accordingly, as described above, when the SiN film is deposited at the $NH_3/SiH_4$ gas flow rate ratio of 2 or less, the N/Si composition ratio falls within the range of 0.94 to 1.0, thereby obtaining sufficient insulation properties.

Further, in the fourth exemplary embodiment, the microcrystalline semiconductor layer 41 may be deposited under deposition conditions different from those of the first exemplary embodiment. Specifically, the oxygen supply gas is introduced upon deposition in the first exemplary embodiment, while in the fourth exemplary embodiment, deposition is carried out without introducing the oxygen supply gas. Thus, the method of manufacturing the TFT according to the fourth exemplary embodiment is similar to that of the first exemplary embodiment except for the processes for depositing the gate insulating film 3 and the microcrystalline semiconductor layer 41, so the description thereof is omitted.

As described above, in the fourth exemplary embodiment, upon deposition of the gate insulating film 3, the $NH_3/SiH_4$ gas flow rate ratio in the mixed gas of main component gases of $SiH_4$, $NH_3$, and $N_2$ is set to 2 or less, thereby forming the gate insulating film 3 having an N/Si composition ratio of 1.0 or less. As a result, the amount of nitrogen contained in the gate insulating film 3 decreases, thereby effectively suppressing the diffusion of nitrogen into the microcrystalline semiconductor layer 41. Accordingly, as with the first exemplary embodiment, the negative offset of the threshold voltage can be suppressed without causing an increase in the optical leak current and the OFF-state current. Therefore, the present invention can be suitably applied to both the pixel TFT 86 and the driving TFT 87. Consequently, it is possible to provide a thin film transistor, a method of manufacturing the same, and a display device that are capable of achieving highly reliable electrical characteristics.

Furthermore, setting the N/Si composition ratio of the gate insulating film 3 to 1.0 or less makes it possible to suppress the offset of the threshold and to obtain the microcrystalline semiconductor layer 41 of high quality with higher crystallinity. Therefore, the reliability of the TFT is improved.

While the fourth exemplary embodiment exemplifies the case where the microcrystalline semiconductor layer 41 containing about the normal level of oxygen is used, the microcrystalline semiconductor layer 41 may contain oxygen at an extremely higher level as in the first exemplary embodiment. That is, the fourth exemplary embodiment may be combined with the first exemplary embodiment, or may not be combined with the first exemplary embodiment. The combination of the fourth exemplary embodiment and the first exemplary embodiment results in an increase in margin for suppressing the offset of the threshold and further stabilization of the production.

The above exemplary embodiments illustrate an example where the microcrystalline semiconductor TFT according to the present invention is mainly applied to the liquid crystal display device, but the present invention is not limited thereto. For example, the present invention can also be applied to display devices using display materials other than liquid crystal, such as an organic EL and electronic paper. Furthermore, the microcrystalline semiconductor TFT according to the present invention can be suitably applied not only to display devices but also to other devices such as a photoelectric conversion device and a semiconductor device.

(Supplementary Note 1)

A method of manufacturing a thin film transistor having a semiconductor layer which is formed on a gate insulating film covering a gate electrode formed on a substrate and which has a microcrystalline semiconductor layer formed in at least an interface in contact with the gate insulating film, the method comprising the steps of:

depositing a nitride film included in the gate insulating film; and depositing the microcrystalline semiconductor layer in contact with the nitride film on the nitride film, wherein in the step of depositing the microcrystalline semiconductor layer, the microcrystalline semiconductor layer is deposited so that the microcrystalline semiconductor layer contains oxygen at a concentration higher than that of contained nitrogen in at least the vicinity of the interface with the nitride film, the nitrogen being diffused from the nitride film.

(Supplementary Note 2)

The method of manufacturing a thin film transistor according to Supplementary note 1, wherein in the step of depositing the microcrystalline semiconductor layer, the microcrystalline semiconductor layer is deposited using at least a main component gas containing $SiH_4$ and $H_2$, and an oxygen supply gas, which is at least one gas selected from the group consisting of $CO_2$, $N_2O$, and $O_2$, diluted by a rare gas.

(Supplementary Note 3)

The method of manufacturing a thin film transistor according to Supplementary note 2, wherein the microcrystalline semiconductor layer is deposited by decreasing a flow rate of the oxygen supply gas stepwise.

(Supplementary Note 4)

The method of manufacturing a thin film transistor according to Supplementary node 1, wherein in the step of depositing the nitride film, the nitride film containing fluorine is deposited using at least a main component gas containing $SiH_4$, $NH_3$, and $H_2$, and at least one fluorine-containing gas selected from the group consisting of $SiF_4$, $C_2F_6$, $C_3F_8$, $SF_6$, and $CF_4$.

(Supplementary Note 5)

The method of manufacturing a thin film transistor according to Supplementary note 1, wherein in the step of depositing the nitride film, an SiN film having an N/Si composition ratio of 1.0 or less is deposited as the nitride film by using a gas having an $NH_3/SiH_4$ gas flow rate ratio of 2 or less.

(Supplementary Note 6)

A method of manufacturing a thin film transistor having a semiconductor layer which is formed on a gate insulating film covering a gate electrode formed on a substrate and which has a microcrystalline semiconductor layer formed in at least an interface in contact with the gate insulating film, the method comprising the steps of:

depositing an SiN film which has an N/Si composition ratio of 1.0 or less and which is included in the gate insulating film; and depositing the microcrystalline semiconductor layer in contact with the SiN film on the SiN film, wherein in the step of depositing the SiN film, the SiN film is deposited using a gas having an $NH_3/SiH_4$ gas flow rate ratio of 2 or less.

From the invention thus described, it will be obvious that the embodiments of the invention may be varied in many ways. Such variations are not to be regarded as a departure from the spirit and scope of the invention, and All such modifications as would be obvious to one skilled in the art are intended for inclusion within the scope of the following claims.

What is claimed is:

1. A thin film transistor comprising:
   a gate electrode formed on a substrate;
   a gate insulating film that includes a nitride film and covers the gate electrode; and
   a semiconductor layer that is disposed to be opposed to the gate electrode with the gate insulating film interposed therebetween, and has a microcrystalline semiconductor layer formed in at least an interface in contact with the nitride film,
   wherein the microcrystalline semiconductor layer contains oxygen at a concentration higher than that of contained nitrogen in at least the vicinity of the interface with the nitride film, the nitrogen being diffused from the nitride film, and
   wherein the concentration of the oxygen contained in the microcrystalline semiconductor layer is set so as to decrease as a distance from the interface with the nitride film.

2. The thin film transistor according to claim 1, wherein a maximum concentration of the oxygen contained in the microcrystalline semiconductor layer is $1 \times 10^{21}$ cm$^{-3}$ or less.

3. The thin film transistor according to claim 2, wherein the nitride film contains fluorine.

4. The thin film transistor according to claim 2, wherein
   the gate insulating film has a nitride film containing no fluorine and a nitride film containing fluorine stacked in this order, and
   the nitride film containing fluorine is in contact with the microcrystalline semiconductor layer.

5. The thin film transistor according to claim 4, wherein the nitride film containing fluorine has substantially the same shape in plan view as the microcrystalline semiconductor layer.

6. The thin film transistor according to claim 1, wherein the nitride film contains fluorine.

7. The thin film transistor according to claim 1, wherein
   the gate insulating film has a nitride film containing no fluorine and a nitride film containing fluorine stacked in this order, and
   the nitride film containing fluorine is in contact with the microcrystalline semiconductor layer.

8. The thin film transistor according to claim 7, wherein the nitride film containing fluorine has substantially the same shape in plan view as the microcrystalline semiconductor layer.

9. The thin film transistor according to claim 3, wherein
   the gate insulating film has a nitride film containing no fluorine and a nitride film containing fluorine stacked in this order, and
   the nitride film containing fluorine is in contact with the microcrystalline semiconductor layer.

10. The thin film transistor according to claim 9, wherein the nitride film containing fluorine has substantially the same shape in plan view as the microcrystalline semiconductor layer.

11. The thin film transistor according to claim 1, wherein the nitride film is an SiN film having an N/Si composition ratio of 1.0 or less.

12. A display device comprising a thin film transistor according to claim 1.

13. A thin film transistor comprising:
    a gate electrode formed on a substrate;
    a gate insulating film that includes a nitride film and covers the gate electrode; and
    a semiconductor layer that is disposed to be opposed to the gate electrode with the gate insulating film interposed therebetween, and has a microcrystalline semiconductor layer formed in at least an interface in contact with the nitride film,
    wherein the microcrystalline semiconductor layer contains oxygen at a concentration higher than that of contained nitrogen in at least the vicinity of the interface with the nitride film, the nitrogen being diffused from the nitride film, and
    wherein the nitride film contains fluorine.

* * * * *